(12) United States Patent
Jin et al.

(10) Patent No.: US 11,004,529 B2
(45) Date of Patent: May 11, 2021

(54) DEVICE INCLUDING MEMORY CONTROLLER, MEMORY DEVICE, AND POWER MANAGEMENT CIRCUIT, AND METHOD OF OPERATING THE SAME

(71) Applicant: SK hynix Inc., Icheon (KR)

(72) Inventors: Yong Jin, Seoul (KR); Yoon Jin Kim, Bucheon (KR); Joong Hyun An, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/861,127

(22) Filed: Apr. 28, 2020

(65) Prior Publication Data

US 2021/0090673 A1 Mar. 25, 2021

(30) Foreign Application Priority Data

Sep. 19, 2019 (KR) .......................... 10-2019-0115362

(51) Int. Cl.
| | |
|---|---|
| *G11C 16/00* | (2006.01) |
| *G11C 29/02* | (2006.01) |
| *G11C 29/12* | (2006.01) |
| *G11C 29/00* | (2006.01) |
| *G11C 29/44* | (2006.01) |
| *G11C 29/50* | (2006.01) |

(52) U.S. Cl.
CPC ...... *G11C 29/021* (2013.01); *G11C 29/12005* (2013.01); *G11C 29/44* (2013.01); *G11C 29/702* (2013.01); *G11C 2029/5004* (2013.01)

(58) Field of Classification Search
CPC . G11C 29/021; G11C 29/12005; G11C 29/44; G11C 29/702
USPC ....................................................... 365/201
See application file for complete search history.

(56) References Cited

U.S. PATENT DOCUMENTS

| | | | | |
|---|---|---|---|---|
| 9,252,603 | B2* | 2/2016 | Shim ...................... | H02J 7/0016 |
| 2012/0062187 | A1* | 3/2012 | Shim ........................ | H02H 3/10 |
| | | | | 320/167 |

FOREIGN PATENT DOCUMENTS

| | | | |
|---|---|---|---|
| KR | 10-2015-0141239 A | 12/2015 | |
| KR | 10-1750055 B1 | 6/2017 | |

* cited by examiner

*Primary Examiner* — Xiaochun L Chen

(57) ABSTRACT

The present technology includes a memory controller that controls auxiliary power cells of which the charge counts is small to be preferentially charged, based on charge count information of each of a plurality of auxiliary power cells included in an auxiliary power device that supplies power to a memory device and a memory controller.

21 Claims, 13 Drawing Sheets

FIG. 5

Table 212-1:

| DEFECTIVE OR NORMAL | AUXILIARY POWER CELL | INITIAL | 1 Cycle | 2 Cycle | 3 Cycle | 4 Cycle | 5 Cycle | 6 Cycle | 7 Cycle | 8 Cycle | 9 Cycle | 10 Cycle |
|---|---|---|---|---|---|---|---|---|---|---|---|---|
| NORMAL | C1 | 0 | 1 | 2 | 3 | 4 | 5 | 6 | 7 | 8 | 9 | 10 |
| NORMAL | C2 | 0 | 1 | 2 | 3 | 4 | 5 | 6 | 7 | 8 | 9 | 10 |
| NORMAL | C3 | 0 | 1 | 2 | 3 | 4 | 5 | 6 | 7 | 8 | 9 | 10 |
| NORMAL | C4 | 0 | 1 | 2 | 3 | 4 | 5 | 6 | 7 | 8 | 9 | 10 |
| NORMAL | C5 | 0 | 1 | 2 | 3 | 4 | 5 | 6 | 7 | 8 | 9 | 10 |
| NORMAL | C6 | 0 | 1 | 2 | 3 | 4 | 5 | 6 | 7 | 8 | 9 | 10 |
| NORMAL | C7 | 0 | 1 | 2 | 3 | 4 | 5 | 6 | 7 | 8 | 9 | 10 |
| NORMAL | C8 | 0 | 0 | 0 | 0 | 0 | 0 | 0 | 0 | 0 | 0 | 0 |
| NORMAL | C9 | 0 | 0 | 0 | 0 | 0 | 0 | 0 | 0 | 0 | 0 | 0 |
| NORMAL | C10 | 0 | 0 | 0 | 0 | 0 | 0 | 0 | 0 | 0 | 0 | 0 |

Table 212-2:

| DEFECTIVE OR NORMAL | AUXILIARY POWER CELL | INITIAL | 1 Cycle | 2 Cycle | 3 Cycle | 4 Cycle | 5 Cycle | 6 Cycle | 7 Cycle | 8 Cycle | 9 Cycle | 10 Cycle |
|---|---|---|---|---|---|---|---|---|---|---|---|---|
| NORMAL | C1 | 0 | 1 | 2 | 3 | 3 | 4 | 5 | 5 | 6 | 7 | 7 |
| NORMAL | C2 | 0 | 1 | 2 | 2 | 3 | 4 | 5 | 5 | 6 | 7 | 7 |
| NORMAL | C3 | 0 | 1 | 2 | 2 | 3 | 4 | 4 | 5 | 6 | 7 | 7 |
| NORMAL | C4 | 0 | 1 | 2 | 2 | 3 | 4 | 4 | 5 | 6 | 6 | 7 |
| NORMAL | C5 | 0 | 1 | 1 | 2 | 3 | 4 | 4 | 5 | 6 | 6 | 7 |
| NORMAL | C6 | 0 | 1 | 1 | 2 | 3 | 3 | 4 | 5 | 6 | 6 | 7 |
| NORMAL | C7 | 0 | 1 | 1 | 2 | 3 | 3 | 4 | 5 | 5 | 6 | 7 |
| NORMAL | C8 | 0 | 0 | 1 | 2 | 3 | 3 | 4 | 5 | 5 | 6 | 7 |
| NORMAL | C9 | 0 | 0 | 1 | 2 | 2 | 3 | 4 | 5 | 5 | 6 | 7 |
| NORMAL | C10 | 0 | 0 | 1 | 2 | 2 | 3 | 4 | 4 | 5 | 6 | 7 |

CHARGE COUNT

▨ SELECTED AUXILIARY POWER CELL

NORMAL AUXILIARY POWER CELL

DEFECTIVE AUXILIARY POWER CELL

| DEFECTIVE OR NORMAL | AUXILIARY POWER CELL | CHARGE COUNT | | | | |
|---|---|---|---|---|---|---|
| | | INITIAL | 1 Cycle | 2 Cycle | 3 Cycle | 4 Cycle |
| NORMAL | C1 | 0 | 1 | 2 | 3 | 3 |
| DEFECTIVE | C2 | 0 | 1 | 2 | 2 | 2(DEFECTIVE) |
| NORMAL | C3 | 0 | 1 | 2 | 2 | 3 |
| NORMAL | C4 | 0 | 1 | 2 | 2 | 3 |
| NORMAL | C5 | 0 | 1 | 1 | 2 | 3 |
| NORMAL | C6 | 0 | 1 | 1 | 2 | 3 |
| NORMAL | C7 | 0 | 1 | 1 | 2 | 3 |
| NORMAL | C8 | 0 | 0 | 1 | 2 | 3 |
| NORMAL | C9 | 0 | 0 | 1 | 2 | 3 |
| NORMAL | C10 | 0 | 0 | 1 | 2 | 2 |

212-3

SELECTED AUXILIARY POWER CELL

| DEFECTIVE OR NORMAL | AUXILIARY POWER CELL | INITIAL | 1 Cycle | 2 Cycle | 3 Cycle | 4 Cycle | 5 Cycle | 6 Cycle | 7 Cycle | 8 Cycle | 9 Cycle | 10 Cycle |
|---|---|---|---|---|---|---|---|---|---|---|---|---|
| | | | | | | CHARGE COUNT | | | | | | |
| NORMAL | C1 | 0 | *1* | 2 | *3* | 3 | 4 | 5 | *6* | 6 | *7* | *8* |
| DEFECTIVE | C2 | 0 | *1* | 2 | 2 | *2(DEFECTIVE)* | *2(DEFECTIVE)* | *2(DEFECTIVE)* | *2(DEFECTIVE)* | *2(DEFECTIVE)* | *2(DEFECTIVE)* | *2(DEFECTIVE)* |
| NORMAL | C3 | 0 | *1* | 2 | 2 | 3 | 4 | *5* | 6 | *6* | *7* | *8* |
| NORMAL | C4 | 0 | *1* | 2 | 2 | 3 | *4* | *5* | 5 | *6* | *7* | *8* |
| NORMAL | C5 | 0 | *1* | 1 | *2* | 3 | *4* | *5* | 5 | *6* | *7* | *8* |
| NORMAL | C6 | 0 | *1* | 1 | *2* | 3 | *4* | 4 | *5* | *6* | *7* | *8* |
| NORMAL | C7 | 0 | *1* | 1 | *2* | 3 | *4* | 4 | *5* | *6* | *7* | 7 |
| NORMAL | C8 | 0 | 0 | *1* | *2* | 3 | 3 | *4* | *5* | *6* | *7* | 7 |
| NORMAL | C9 | 0 | 0 | *1* | *2* | 3 | 3 | *4* | *5* | 6 | 6 | *7* |
| NORMAL | C10 | 0 | 0 | *1* | *2* | 2 | 3 | *4* | *5* | 6 | 6 | *7* |

SELECTED AUXILIARY POWER CELL 212-4

DEVICE INCLUDING MEMORY CONTROLLER, MEMORY DEVICE, AND POWER MANAGEMENT CIRCUIT, AND METHOD OF OPERATING THE SAME

CROSS-REFERENCE TO RELATED APPLICATION

The present application claims priority under 35 U.S.C. § 119(a) to Korean patent application number 10-2019-0115362, filed on Sep. 19, 2019, the entire disclosure of which is incorporated herein by reference in its entirety.

BACKGROUND

Field of Invention

The present disclosure relates to an electronic device, and more particularly, to a storage device including a memory controller, a memory device, and a power management circuit, and a method of operating the same.

Description of Related Art

A storage device is a device that stores data. The storage device includes a memory device in which data is stored and a memory controller controlling the memory device. A memory device (semiconductor memory device) is a memory device that is implemented using a semiconductor such as silicon (Si), germanium (Ge), gallium arsenide (GaAs), or indium phosphide (InP). Memory devices are largely classified into volatile memory devices and non-volatile memory devices.

A volatile memory device is a memory device in which stored data is lost when its power supply is cut off. Volatile memory devices include static RAM (SRAM), a dynamic RAM (DRAM), synchronous DRAM (SDRAM), and the like. A non-volatile memory device is a memory device that maintains stored data even though its power supply is cut off. Non-volatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory is largely divided into a NOR type and a NAND type.

A storage device may include an auxiliary power device that may supply power for a limited amount of time to secure the reliability of data stored in the storage device.

SUMMARY

An embodiment of the present disclosure provides a storage device including a memory controller, a memory device, and a power management circuit having improved reliability, and a method of operating the storage device.

According to an embodiment of the present disclosure, a memory controller that controls an operation of a memory device may include an auxiliary power cell information storage including charge count information of each of a plurality of auxiliary power cells included in an auxiliary power device that supplies auxiliary power as a substitute for main power to the memory device and the memory controller, and an auxiliary power cell controller configured to control charging of the plurality of auxiliary power cells so that the differences between respective charge counts of the plurality of auxiliary power cells are minimized.

According to an embodiment of the present disclosure, a storage device may include a memory device including a plurality of memory blocks, a memory controller configured to control an operation of the memory device, and a power management circuit configured to supply power to the memory device and the memory controller. The power management circuit may include a power controller configured to receive main power from an outside of the power management circuit, and an auxiliary power device including a plurality of auxiliary power cells. The memory controller may obtain auxiliary power cell information stored in at least one memory block of the plurality of memory blocks, and control the auxiliary power device so that selected auxiliary power cells, which are determined based on charge count information of the plurality of auxiliary power cells included in the auxiliary power cell information, are charged, and unselected auxiliary power cells are not charged.

According to an embodiment of the present disclosure, a method of operating a memory controller that controls an operation of a memory device may include obtaining charge counts respectively corresponding to each of a plurality of auxiliary power cells configured to supply auxiliary power to the memory device and the memory controller, determining, based on the charge counts, predetermined number of selected auxiliary power cells that are auxiliary power cells to be charged from among the plurality of auxiliary power cells, and controlling the selected auxiliary power cells to charge the selected auxiliary power cells.

According to an embodiment of the present technology, a storage device including a memory controller, a memory device, and a power management circuit having improved reliability, and a method of operating the same are provided.

BRIEF DESCRIPTION OF THE DRAWINGS

FIG. 5 illustrates data stored in an auxiliary power cell information storage according to an embodiment.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, an embodiment of the present disclosure will be described with reference to the accompanying drawings so that those skilled in the art may easily implement the technical spirit of the present disclosure.

Figure 1:
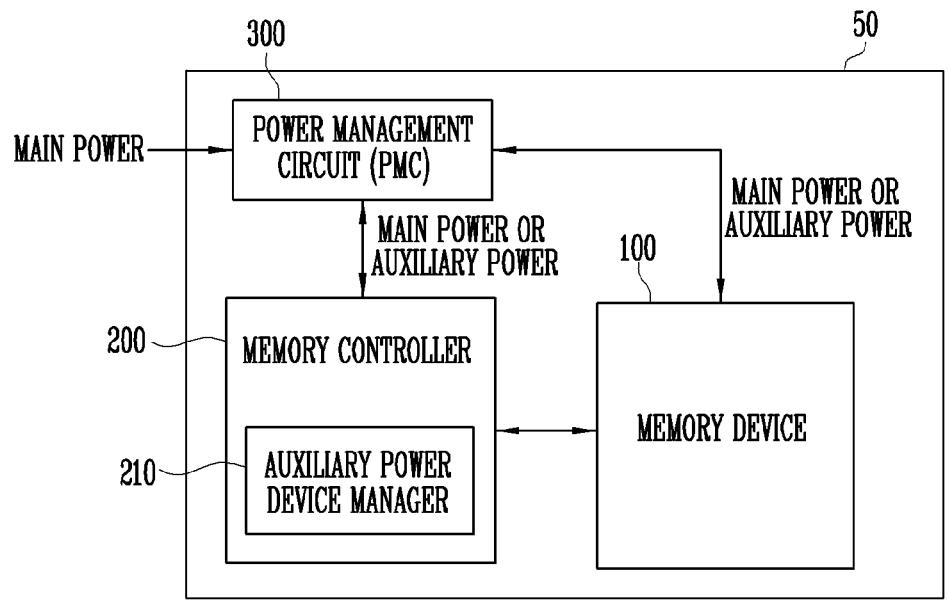
FIG. 1 illustrates a storage device including a memory controller according to an embodiment of the present disclosure.

FIG. 1 illustrates a storage device 50 including a memory controller 200 according to an embodiment of the present disclosure.

The storage device 50 may include a memory device 100, the memory controller 200, and a power management circuit 300.

The storage device 50 may be a device that stores data under control of a host such as a cellular phone, a smartphone, an MP3 player, a laptop computer, a desktop computer, a game player, a TV, a tablet PC, or an in-vehicle infotainment system. The storage device 50 may be manufactured as one of various types of storage devices according to a host interface that is a communication method with the host. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array (not shown) including a plurality of memory cells storing the data. The memory cell array may include a plurality of memory blocks. Each memory block may include a plurality of memory cells. The memory block may be a unit for performing an erase operation of erasing the data stored in the memory device 100. In an embodiment, each memory block may include a plurality of pages. The page may be a unit for performing a program operation of storing the data in the memory device 100 or a read operation of reading the data stored in the memory device 100. In an embodiment, the memory device 100 may be a non-volatile memory device.

In an embodiment, the memory device 100 may include one or more of a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, embodiments are described wherein the memory device 100 is a NAND flash memory, but embodiments are not limited thereto.

In an embodiment, the memory device 100 may be implemented in a three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, each of the memory cells included in the memory device 100 may operate as a single level cell (SLC) that stores one data bit, a multi-level cell (MLC) that stores two data bits, a triple level cell (TLC) that stores three data bits, or a quad level cell (QLC) that stores four data bits.

The memory controller 200 may control an overall operation of the storage device 50. When power is applied to the storage device 50, the memory controller 200 may execute firmware. The firmware may include a host interface layer HIL that receives requests from the host device or outputs responses to the host device, a flash translation layer (FTL) that manages an operation between an interface of the host device and an interface of the memory device 100, and a flash interface layer (FIL) that provides a command to the memory device 100 or receive a response from the memory device 100.

The memory controller 200 may include an auxiliary power device manager 210. The auxiliary power device manager 210 may manage whether auxiliary power cells are charged so that the charge counts of the auxiliary power cells included in the power management circuit are uniform. In the illustrative embodiment shown in FIG. 1, the auxiliary power device manager 210 is included in the memory controller 200, but may be included in the power management circuit 300 in various embodiments.

The memory device 100 is configured to receive a command and an address from the memory controller 200 and to access an area selected according to the address of the memory device 100. In an embodiment, when a read request is received from the host, the memory controller 200 may receive a logical address for identifying data to be read from the host. The memory controller 200 may obtain a physical address corresponding to the input logical address and provide a read command and a physical address to the memory device 100. During the read operation, the memory device 100 may read data from an area selected by the physical address. In an embodiment, when a program request is received from the host, the memory controller 200 may provide a program instruction and the physical address to the memory device 100. During the program operation, the memory device 100 may perform the program operation of storing data in the area selected by the physical address. In an embodiment, during the erase operation, the memory controller 200 may provide an erase command and the physical block address to the memory device 100. The memory device 100 may erase data stored in the area selected by the physical block address.

In an embodiment, the memory controller 200 may control the memory device 100 to perform the program operation, the read operation, or the erase operation by itself without receiving a corresponding request from the host. For example, the memory controller 200 may control the memory device 100 to perform background operations such as wear leveling, garbage collection, or read reclaim.

The power management circuit 300 may provide a voltage to the memory device 100 and the memory controller 200. In an embodiment, the power management circuit 300 may provide the voltage of various levels required according to a type of the storage device 50. The voltages provided to the memory device 100 and the memory controller 200 by the power management circuit 300 may be power voltages VCCE of the memory device 100 and the memory controller 200, respectively. The power management circuit 300 may receive main power from the outside. In an embodiment, the power management circuit 300 may include an auxiliary power device. The power management circuit 300 may charge the auxiliary power device using the supplied main power. The power management circuit 300 may provide any one of the main power or auxiliary power produced using the auxiliary power device to the memory device 100 and the memory controller 200.

A voltage level of the main power supplied to the storage device 50 may be lower than a specified voltage level. For example, a sudden power off (SPO) where the main power is suddenly cut off may occur. The memory device 100 and the memory controller 200 included in the storage device 50 may be required to completely perform various operations before their power is cut off. For example, the memory controller 200 may be required to store data temporarily stored in a write cache buffer of the storage device 50 to the non-volatile memory device 100 before its power is cut off. In another example, the memory controller 200 may be required to complete a map update operation of storing the logical-to-physical address mapping data to the non-volatile memory device 100 before its power is cut off. Accordingly, when main power is unexpectedly cut off, the storage device 50 may provide the auxiliary power to the memory device 100 and the memory controller 200 for a limited time so that the required operations may be performed to completion.

Referring to FIG. 1, the main power input to the power management circuit 300 may be supplied to the memory device 100 and the memory controller 200. When the voltage level of the main power becomes lower than a specified voltage level, the auxiliary power stored in the power management circuit 300 may be supplied to the memory device 100 and the memory controller 200 for a limited time.

The auxiliary power may be power supplied by a plurality of auxiliary power cells included in the auxiliary power device using electrical energy stored in the plurality of auxiliary power cells. An auxiliary power cell may be configured of a capacitor or super-capacitor capable of storing electrical energy. There may be a limit to an amount of the electrical energy that may be stored, due to a space and cost of the plurality of capacitors. The auxiliary power device may be configured to store enough electrical energy to guarantee that the operations that need to be performed when main power is cut off may be completed. That is, the auxiliary power device that supplies the auxiliary power may include a minimum number of auxiliary power cells capable of securing data reliability. The amount of electrical energy provided by a minimum number of auxiliary power cells may correspond to the amount needed to store data that may be temporarily stored in a volatile memory device (not shown) included in the storage device 50 into the memory device 100.

The auxiliary power cells included in the auxiliary power device may deteriorate when subjected to repeated charging and discharging. The auxiliary power device may be designed to include the minimum number of auxiliary power cells capable of ensuring the reliability of the data stored in the storage device 50 when the voltage level of the main power becomes lower than a specific voltage level. As a result of repeated charging and discharging of all of the predetermined number of auxiliary power cells, some of the auxiliary power cells may be deteriorated. In a storage device 50 that incorporates only the minimum number of auxiliary power cells needed to ensure the reliability of the data, when some of the auxiliary power cells become deteriorated and fail to fully perform their function, the reliability of the data stored in the storage device 50 may not be guaranteed, and therefore, a lifespan of the storage device 50 may be shorter than expected.

In an embodiment according to the present technology, the number of auxiliary power cells included in the auxiliary power device may be greater than the minimum number that may guarantee the reliability of the storage device 50. For example, assuming that the number of auxiliary power cells providing the required amount of electrical energy is N, in an embodiment according to the present technology, the auxiliary power device may further include M reserve auxiliary power cells. The memory controller 200 may include the auxiliary power device manager 210. The auxiliary power device manager 210 may manage the auxiliary power cells included in the auxiliary power device. Specifically, the auxiliary power device manager 210 may control whether or not to perform charging so that the charge counts of each of the auxiliary power cells are evenly distributed. The auxiliary power cells that are repeatedly charged and discharged are more likely to be defective. Therefore, the auxiliary power device manager 210 may manage the charge counts of each of the auxiliary power cells to increase the lifespan of the entire storage device 50.

An embodiment of the present technology may be applied to various electronic devices using an auxiliary power device in addition to being applied to the storage device 50. For various reasons, an electronic device may require an auxiliary power device to supply power to the electronic device together with or separately from main power. The electronic device requiring the auxiliary power device may include the auxiliary power device manager 210 according to an embodiment of the present technology. The auxiliary power device manager 210 included in the electronic device may manage the charge counts of a plurality of auxiliary power cells included in the auxiliary power device as described herein.

An operation of the auxiliary power device manager 210 according to an embodiment of the present disclosure will be described in more detail with reference to FIGS. 4 to 12.

Figure 2:
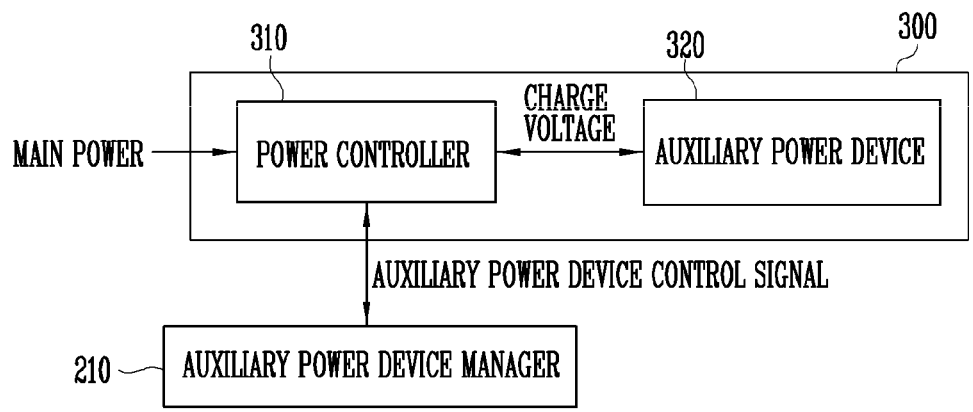
FIG. 2 illustrates a configuration of a power management circuit of FIG. 1.

FIG. 2 illustrates a configuration of the power management circuit (PMC) 300 of FIG. 1.

The power management circuit 300 may include a power controller 310 and an auxiliary power device 320. The power controller 310 may select one of the main power and the auxiliary power and provide the selected power to the memory device and the memory controller. The power controller 310 may receive an auxiliary power device control signal from the auxiliary power device manager 210 described with reference to FIG. 1. The auxiliary power device control signal may control whether the auxiliary power cells included in the auxiliary power device 320 are activated or inactivated. That is, each of the auxiliary power cells may be turned on or turned off. The auxiliary power cells that are turned on may be charged using the main power. The auxiliary power cells that are turned off may not be charged using the main power.

Specifically, the power controller 310 may receive the main power from the outside. The power controller 310 may provide a charge voltage to the auxiliary power device 320. The auxiliary power device 320 may charge the auxiliary power cells included therein by using the charge voltage. In a general situation, the power controller 310 may provide the main power input from the outside to the memory device and the memory controller. In addition, the power controller 310 may provide the charge voltage to the auxiliary power device using the main power input from the outside. When the main power is not input or the voltage level of the main power is lower than a specified voltage level, the power management circuit 300 may not receive the main power, and the power controller 310 may provide the auxiliary power to the memory device and the memory controller using electrical energy stored in the auxiliary power device 320. The auxiliary power may have a limited size (e.g. a limited number of milliamp-hours available at a prescribed voltage) because it is supplied by the auxiliary power cells included in the auxiliary power device 320.

Figure 3:
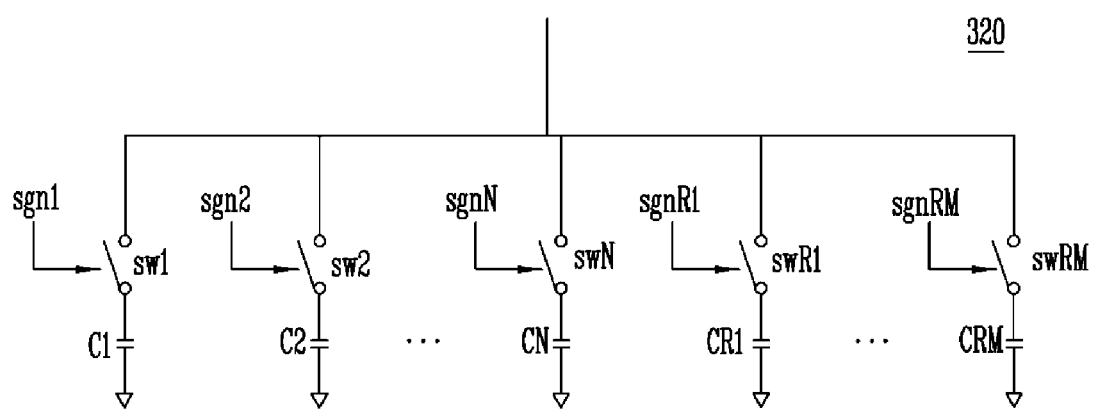
FIG. 3 illustrates auxiliary power cells included in an auxiliary power device according to an embodiment.

FIG. 3 is a diagram illustrating an embodiment of the auxiliary power cells included in the auxiliary power device.

Referring to FIG. 3, the auxiliary power device 320 may include a plurality of auxiliary power cells C1 to CN and CR1 to CRM, and a plurality of switches sw1 to swN and swR1 to swRM. The plurality of auxiliary power cells C1 to CN and CR1 to CRM may be electrical elements that store electrical energy. For example, the plurality of auxiliary power cells C1 to CN and CR1 to CRM may be capacitors. For convenience of description, the plurality of auxiliary power cells C1 to CM and CR1 to CRM are illustrated as being connected in parallel one by one. However, the plurality of auxiliary power cells C1 to CM and CR1 to CRM may be connected in series or may be connected in a mixture of series and parallel. In addition, the auxiliary power cells may have different respective energy storage capacities (e.g., different capacitance values). The switches sw1 to swN and swR1 to swRM may respectively control whether the auxiliary power cells C1 to CM and CR1 to CRM are charged. Specifically, the switches sw1 to swN and swR1 to swRM providing electrical connection to the auxiliary power cells C1 to CM and CR1 to CRM may be individually turned on or off in response to cell selection signals sgn1 to sgnN and sgnR1 to sgnRM, respectively.

For example, when the main power is not input, it is assumed that that the amount of electrical energy required to preserve the data stored in the storage device is equal to (or slightly less than) the amount of electrical energy stored in X auxiliary power cells. In an embodiment where X is equal to N, when switch sw1 is turned on in response to the cell selection signal sgn1, the auxiliary power cell C1 may be charged. In the same manner, the auxiliary power cells C2 to CN may be charged when switches sw2 to swN are turned on, respectively. Since the X=N auxiliary power cells, which are a number of auxiliary power cells sufficient to provide the auxiliary power needed to guarantee the reliability of the storage device in this example, have been charged, swR1 to swRM may be turned off, and thus the auxiliary power cells CR1 to CRM may not be charged.

In another embodiment, and X auxiliary power cells among the auxiliary power cells C1 to CN and CR1 to CRM may be selected and charged.

According to an embodiment, the selection of the plurality of auxiliary power cells to be charged from among the existing auxiliary power cells may be based on the respective numbers of charging operations (hereinafter, the charge counts) that have been previously performed on the plurality of auxiliary power cells. In an embodiment, the selection of the auxiliary power cells to be charged may be determined according to an operation of the auxiliary power device manager which will be described below. In an embodiment, the switches connected to the respective auxiliary power cells may be turned on or turned off according to control signals provided by the auxiliary power device manager.

Figure 4:
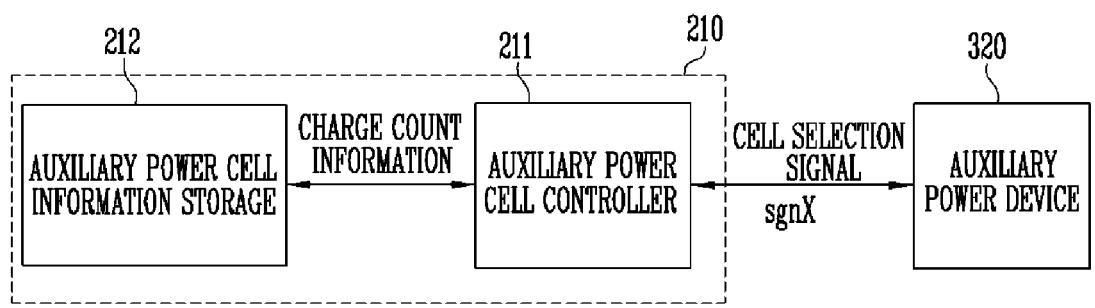
FIG. 4 illustrates a configuration of an auxiliary power device manager according to an embodiment of the present disclosure.

FIG. 4 illustrates a configuration of the auxiliary power device manager 210 according to an embodiment of the present disclosure.

The auxiliary power device manager 210 may include an auxiliary power cell controller 211 and an auxiliary power cell information storage 212.

The auxiliary power cell controller 211 may obtain auxiliary power cell information stored in a memory device (for example, the non-volatile memory device 100 of FIG. 1) when power is applied. The obtained auxiliary power cell information may be stored in the auxiliary power cell information storage 212. The auxiliary power cell information storage 212 may be a volatile memory. The auxiliary power cell information storage 212 may be included in a buffer memory device (not shown). The auxiliary power cell information may include at least one of a cell number, charge count, and defect information for each of a plurality of auxiliary power cells.

The auxiliary power cell controller 211 may obtain charge count information corresponding to each of the auxiliary power cells from the auxiliary power cell information storage 212. The auxiliary power cell controller 211 may select one or more of the auxiliary power cells for charging based on the obtained charge count information. In the charge count information, whenever electrical energy is accumulated into an auxiliary power cell, the charge count corresponding to that auxiliary power cell may increase by one. That is, each time a charging operation is performed to store additional electrical energy in an auxiliary power cell, the charge count of that auxiliary power cell may increase by one from a previous number. Subsequently, the electrical energy stored in the auxiliary power cell may be discharged. For example, when the storage device 50 changes from an ON state to an OFF state, the electrical energy charged in the auxiliary power cell may be discharged. In another example, when the main power is suddenly cut off, the electrical energy that has been charged in the auxiliary power cell may be discharged as it is being used by the memory controller to, for example, perform operations related to guaranteeing the integrity of the data in the storage device 50. When the discharged auxiliary power cell is again charged with electrical energy, the charge count of that auxiliary power cell may increase by one from its previous value.

In an embodiment, the auxiliary power cell controller 211 may determine one or more of the auxiliary power cells having smaller respective charge counts as the selected auxiliary power cells using the charge count information for the auxiliary power cells. The number of selected auxiliary power cells may be less than a total number of auxiliary power cells included in the auxiliary power device. For example, assuming that the total number of auxiliary power cells included in the auxiliary power device is N+M, the auxiliary power cell controller 211 may determine the number of selected auxiliary power cells as X=N and may obtain the charge counts stored in the auxiliary power cell information storage 212. The auxiliary power cell controller 211 may determine the X selected auxiliary power cells in an order started from the smallest charge counts, that is, by first selecting the auxiliary power cells with the smallest charge counts, then selecting the auxiliary power cells with the next smallest charge counts, and so on until X auxiliary power cells are selected. Among the auxiliary power cells of which the charge counts are the same, the auxiliary power cell having a smaller corresponding cell number may be preferentially determined as the selected auxiliary power cell.

The selected auxiliary power cells may be controlled by the auxiliary power cell controller 211 to charge a voltage therein. For example, the selected auxiliary power cell may be a capacitor, and a charge operation of receiving the charge voltage and temporarily storing charge in the capacitor may be performed. The auxiliary power cell controller 211 may provide a cell selection signal sgnX to the auxiliary power device 320 so that the selected auxiliary power cells may be charged (and the auxiliary power cells that are not selected may not be charged). The auxiliary power device 320 may receive the cell selection signal sgnZ. The switch swZ included in the auxiliary power device 320 may be turned on or turned off according to the received cell selection signal sgnZ. When the switch swZ is turned on, the auxiliary power cells electrically connected to the turned on switch swZ may be charged with the voltage provided through the power controller 310 shown in FIG. 2. The auxiliary power cells electrically connected to a turned off switch may not be charged with the voltage provided from the power controller 310.

In an embodiment, the auxiliary power cell controller 211 may provide the cell selection signal sgnZ so that the selected auxiliary power cells are charged, and may update the corresponding charge count information stored in the auxiliary power cell information storage 212. Specifically, for each of the selected auxiliary power cells, the auxiliary power cell controller 211 may increase the corresponding charge count information in the auxiliary power cell information storage 212 to indicate a charge count one higher than the previously indicated charge count. The auxiliary power device manager 210 may perform an operation of storing the auxiliary power cell information stored in the auxiliary power cell information storage 212 into the memory device 100. The auxiliary power cell information may include the charge count information.

In an embodiment, the auxiliary power device manager 210 may store the auxiliary power cell information stored in the auxiliary power cell information storage 212 into the memory device 100 in response to the completion of the charging of the selected auxiliary power cells. In another embodiment, the auxiliary power device manager 210 may store the auxiliary power cell information stored in the auxiliary power cell information storage 212 into the memory device 100 when the main power of the storage device is turned off. Since the memory device 100 is a non-volatile memory device, the memory device 100 may preserve the auxiliary power cell information even though power is not supplied. The memory controller 200 may obtain and use the auxiliary power cell information stored in the memory device 100 when the memory controller 200 needs the auxiliary power cell information. For example, when power is applied to the storage device or power is applied to the memory controller 200 and the memory device 100, the memory controller 200 may obtain the auxiliary power cell information from the memory device 100.

FIG. 5 illustrates the data stored in the auxiliary power cell information storage of FIG. 4, according to embodiments.

Referring to FIG. 5, auxiliary power cell information storages 212-1 and 212-2 may include a plurality of entries including a cell number identifying a respective auxiliary power cell, the charge count information indicating the charge count of that auxiliary power cell, and defect information indicating whether that auxiliary power cells is defective. In FIG. 5, the auxiliary power cell information storages 212-1 and 212-2 as illustrated include initial charge counts and charge counts for ten cycles of operation of respective embodiments. Referring to the auxiliary power cell information storages 212-1 and 212-2, one cycle (hereinafter referred to as a charging cycle) may include an operation in which one or more of the auxiliary power cells are charged once according to the control signal of the auxiliary power cell controller 211. In an embodiment, when power is applied to the storage device, an operation of charging the auxiliary power cells may be performed. In addition, when the power of the storage device is turned off, the charges charged in the auxiliary power cells may be discharged. In another embodiment, when power is applied to the storage device, not all auxiliary power cells are charged, but only some of the auxiliary power cells may be charged. In another embodiment, when power is applied to the storage device, the auxiliary power cells may be charged one by one. Determining whether each of the auxiliary power cells is defective will be described in more detail with reference to FIGS. 7 to 9.

In an embodiment illustrated by the auxiliary power cell information storage 212-1, the auxiliary power cells are charged without considering the respective charge counts of the auxiliary power cells. In comparison with this, the auxiliary power cell information storage 212-2 illustrates an embodiment wherein the auxiliary power cells are charged based on the charge count information of the auxiliary power cells. The number of auxiliary power cells to be charged may have a predetermined value. For example, if a minimum number of charged auxiliary power cells required to ensure the reliability of the data stored in the memory device is seven, then only seven of the auxiliary power cells may be charged. Although the auxiliary power cell information storages 212-1 and 212-2 correspond to an auxiliary power device including auxiliary power cells C1 to C10, embodiments are not limited thereto, and more or fewer auxiliary power cells may be included in the auxiliary power cell information storages 212-1 and 212-2. Hereinafter, the auxiliary power cell information storage 212-1 will be described.

In an embodiment illustrated in the auxiliary power cell information storage 212-1, each of a plurality of auxiliary power cells C1 to C10 included in the auxiliary power device may be normal (that is, non-defective) auxiliary power cells. Initially, it is assumed that all of the charge counts of the auxiliary power cells C1 to C10 are zero. When the main power is input from the outside, the power controller 310 shown in FIG. 2 may provide the charge voltage to the auxiliary power device 320. In a first charging cycle, the auxiliary power device 320 may charge the auxiliary power cells C1 to C7 among the plurality of auxiliary power cells C1 to C10 using the charge voltage. In the second charging cycle, the auxiliary power cells C1 to C7 may be charged again. In the same manner, charging and discharging of the auxiliary power cells C1 to C7 may be repeated for a plurality of charging cycles. When a tenth charging cycle is completed, the respective charge counts of the auxiliary power cells C1 to C7 may be 10. Each of the charge counts of the auxiliary power cells C8 to C10 may be zero. In this embodiment, when a defective auxiliary power cell occurs among the auxiliary power cells C1 to C7, the defective auxiliary power cell may be replaced using a normal auxiliary power cell among the auxiliary power cells C8 to C10.

In another embodiment, illustrated using the auxiliary power cell information storage 212-2, the auxiliary power device may include a plurality of auxiliary power cells C1 to C10. All of each of the plurality of auxiliary power cells C1 to C10 may be normal auxiliary power cells. Initially, it is assumed that all of the charge counts of the auxiliary power cells C1 to C10 are zero. When the main power is input from the outside, the power controller 310 shown in FIG. 2 may provide the charge voltage to the auxiliary power device 320. The auxiliary power device 320 may charge a predetermined number of auxiliary power cells (here, seven) of among the plurality of auxiliary power cells C1 to C10, using the charge voltage.

In the first charging cycle, the auxiliary power cell controller 211 of FIG. 4 may determine the auxiliary power cells C1 to C7 as the selected auxiliary power cells to be charged with reference to the auxiliary power cell information storage 212-2. When the charge counts of the auxiliary power cells are the same, the auxiliary power cells having a smallest corresponding cell numbers may be preferentially selected as the selected auxiliary power cells. The auxiliary power cell controller 211 may assert the cell selection signals sgn1 to sgn7 to the auxiliary power device. In response to the cell selection signal sgn1 being asserted, the switch sw1 connected to the auxiliary power cell C1 may be turned on so that the auxiliary power cell C1 may be electrically connected to the power controller 310 of FIG. 2. The auxiliary power cell C1 may then receive the charge voltage and may be charged. In the same manner, the auxiliary power cells C2 to C7 may be charged in response to the cell selection signals sgn2 to sgn7 being asserted by the auxiliary power cell controller 211. The auxiliary power cell controller 211 may increment and store the charge counts corresponding to the auxiliary power cells C1 to C7 in the auxiliary power cell information storage 212-2. That is, since the auxiliary power cells C1 to C7 are selected as the selected auxiliary power cells in the first charging cycle, the charge counts respectively corresponding to the auxiliary power cells C1 to C7 may each be increased by one.

In the second charging cycle, the auxiliary power cell controller 211 of FIG. 4 may obtain the charge count information of the auxiliary power cells with reference to the auxiliary power cell information storage 212-2. The auxiliary power cell controller 211 may determine the auxiliary power cells having smallest charge counts as the selected auxiliary power cells. Since the charge count information corresponding to the auxiliary power cells C8 to C10 stored in the auxiliary power cell information storage 212-2 is 0, the auxiliary power cell controller 211 may select the auxiliary power cells C8 to C10 as selected auxiliary power cells. Next, the auxiliary power cell controller 211 may further determine four additional selected auxiliary power cells with reference to the auxiliary power cell information storage 212-2. Since all of the charge counts of the auxiliary power cells C1 to C7 are 1, the four additional selected auxiliary power cells may be determined from among C1 to C7. In the same manner as in the first charging cycle, when the charge counts of the auxiliary power cells are the same, the auxiliary power cells having the smallest corresponding cell numbers may be preferentially selected as selected auxiliary power cells. Therefore, the selected auxiliary power cells C1 to C4 may be determined. In another embodiment, the four additional selected auxiliary power cells may be selected in a random manner from among auxiliary power cells C1 to C7. Assuming for this example that auxiliary power cells C1 to C4 are determined as the selected auxiliary power cells, the auxiliary power cell controller 211 may assert the cell selection signals sgn1 to sgn4 and sgn8 to sgn10 to the auxiliary power device. In response to the cell selection signals sgn1 to sgn4 and sgn8 to sgn10 being asserted, the switches sw1 to sw4 and sw8 to sw10 connected to the auxiliary power cells C1 to C4 and C8 to C10 may be turned on so that the auxiliary power cells C1 to C4 and C8 to C10 may be electrically connected to the power controller 310 of FIG. 2. The auxiliary power cells C1 to C4 and C8 to C10 may therefore receive the charge voltage and store the charge voltage. The auxiliary power cell controller 211 may update and store the respective charge counts corresponding to the auxiliary power cells C1 to C4 and C8 to C10 in the auxiliary power cell information storage 212-2. That is, since the auxiliary power cells C1 to C4 and C8 to C10 are selected as the selected auxiliary power cells in the second charging cycle, the charge count corresponding to each of the auxiliary power cells C1 to C4 and C8 to C10 may be increased by one.

In a third charging cycle, the auxiliary power cell controller 211 of FIG. 4 may obtain the charge count information of the auxiliary power cells with reference to the auxiliary power cell information storage 212-2. Referring to the auxiliary power cell information storage 212-2, the respective charge counts corresponding to each of the auxiliary power cells C1 to C4 may be two. The respective charge counts corresponding to the auxiliary power cells C5 to C10 may be one. The auxiliary power cell controller 211 may determine the auxiliary power cells C5 to C10 having the smallest charge counts as the selected auxiliary power cells. The auxiliary power cell controller 211 may further determine one additional selected auxiliary power cell with reference to the auxiliary power cell information storage 212-2. Since each of the charge counts of the auxiliary power cells C1 to C4 are 2, the auxiliary power cell controller 211 may determine one selected auxiliary power cell from among auxiliary power cells C1 to C4, either by selecting one having the smallest corresponding cell number or by selecting one in a random manner, as described above. In the example of FIG. 5, auxiliary power cell C1 is determined as the selected auxiliary power cell. Next, the auxiliary power cell controller 211 may assert the cell selection signals sgn1 and sgn5 to sgn10 to the auxiliary power device. In response to the cell selection signals sgn1 and sgn5 to sgn10 being asserted, the switches sw1 and sw5 to sw10 connected to the auxiliary power cells C1 and C5 to C10 may be turned on so that the auxiliary power cells C1 and C5 to C10 may be electrically connected to the power controller 310 of FIG. 2. The auxiliary power cells C1 and C5 to C10 may therefore receive the charge voltage and store the charge voltage. The auxiliary power cell controller 211 may update and store the charge counts corresponding to the auxiliary power cells C1 and C5 to C10 in the auxiliary power cell information storage 212-2. After the auxiliary power cell controller 211 has performed a total of ten charging cycles in this manner, all of the charge counts of the auxiliary power cells C1 to C10 may be seven.

According to an embodiment, after the ten auxiliary power cell charge operations are ended, all of the charge counts of the auxiliary power cells C1 to C7 included in the auxiliary power cell information storage 212-1 may be ten, and all of the charge counts of the auxiliary power cells C8 to C10 may be zero. According to another embodiment, after the ten auxiliary power cell charge operations are performed, all of the charge counts of the auxiliary power cells C1 to C10 included in the auxiliary power cell information storage 212-2 may be seven. That is, the respective charge counts of the auxiliary power cells may be uniformly distributed.

The auxiliary power cell information storage 212-2 may include a plurality of pieces of charge count information of each of the auxiliary power cells as described with reference to FIG. 5. In another embodiment, the auxiliary power cell information storage 212-2 may include final charge count information of each of the auxiliary power cells.

Figure 6:
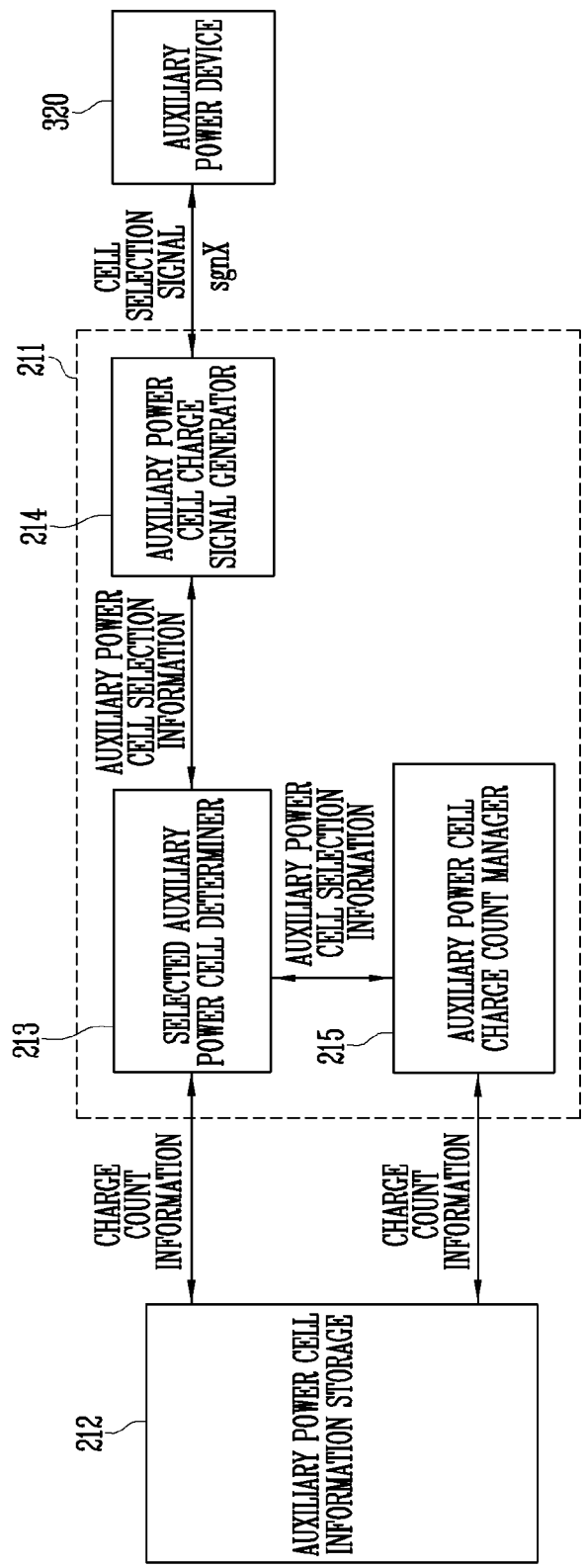
FIG. 6 illustrates an operation of an auxiliary power cell controller according to an embodiment.

FIG. 6 is a diagram for describing an operation of the auxiliary power cell controller 211 in more detail, according to an embodiment.

The auxiliary power cell controller 211 may include a selected auxiliary power cell determiner 213, an auxiliary power cell charge signal generator 214, and an auxiliary power cell charge count manager 215. The auxiliary power cell controller 211 may obtain the auxiliary power cell information from the auxiliary power cell information storage 212. The auxiliary power cell information may include the charge count information of each of the auxiliary power cells. The auxiliary power cell controller 211 may determine the selected auxiliary power cells that are to be charged using the obtained auxiliary power cell information. The auxiliary power cell controller 211 may control the auxiliary power device 320 to charge the selected auxiliary power cell. Specifically, the selected auxiliary power cell determiner 213 may obtain the auxiliary power cell information corresponding to each of the plurality of auxiliary power cells included in the auxiliary power device 320 from the auxiliary power cell information storage 212. In an embodiment, the selected auxiliary power cell determiner 213 may obtain the charge count information of each of the auxiliary power cells included in the auxiliary power cell information storage 212. The charge count information may include a final charge count (that is, a most recently updated charge count) of each of the auxiliary power cells. The selected auxiliary power cell determiner 213 may determine the selected auxiliary power cells that are to be charged based on the obtained charge count information. The number of selected auxiliary power cells may be a predetermined number. As described with reference to FIG. 5, the selected auxiliary power cell determiner 213 may determine the auxiliary power cells having the smallest charge counts as the selected auxiliary power cells with reference to the final charge count information.

The selected auxiliary power cell determiner 213 may provide auxiliary power cell selection information to the auxiliary power cell charge signal generator 214. The auxiliary power cell charge signal generator 214 may generate cell selection signals sgnX corresponding to the received auxiliary power cell selection information, respectively. The cell selection signal sgnX may include a signal for determining whether the switches respectively connected to the auxiliary power cells are turned on. The cell selection signal sgnX may include a signal for turning on the switches connected to the selected auxiliary power cells determined by the selected auxiliary power cell determiner 213. The cell selection signal sgnX may include a signal for turning off switches connected to non-selected auxiliary power cells determined according to the selected auxiliary power cell determiner 213. In another embodiment, the cell selection signal sgnX may include a signal for maintaining the turned off state of the switches connected to the non-selected auxiliary power cells. Selected auxiliary power cells for which the corresponding switches are turned on may be charged. The non-selected auxiliary power cells for which the corresponding switches are turned off may not be charged.

The selected auxiliary power cell determiner 213 may provide the auxiliary power cell selection information to the auxiliary power cell charge count manager 215. The auxiliary power cell charge count manager 215 may update the charge counts of each of the auxiliary power cells and provide the updated charge counts to the auxiliary power cell information storage 212. The auxiliary power cell information storage 212 may store the updated charge count information received from the auxiliary power cell charge count manager 215. Specifically, the charge counts of the selected auxiliary power cells included in the auxiliary power cell information storage 212 may be increased by one. The charge counts of the auxiliary power cells other than the selected auxiliary power cells may be maintained at their previous values. In another embodiment, the auxiliary power cell information storage 212 may include the latest charge count information of each of the auxiliary power cells.

Figure 7:
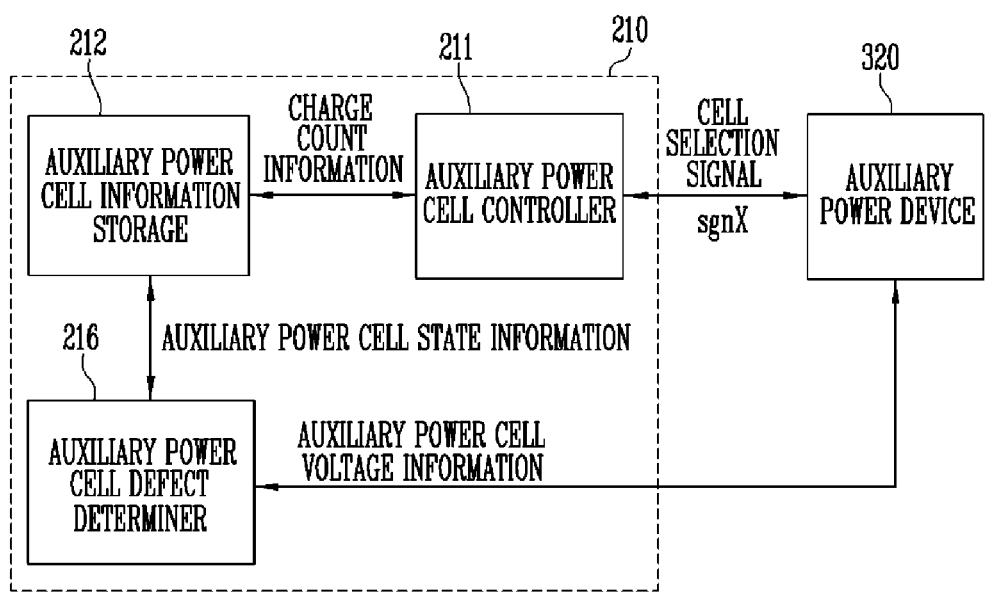
FIG. 7 illustrates details of a process for determining whether the auxiliary power cells included in the auxiliary power device are defective according to an embodiment.

FIG. 7 illustrates details of determining whether the auxiliary power cells included in the auxiliary power device are defective.

Referring to FIG. 7, the auxiliary power device manager 210 may include the auxiliary power cell controller 211, the auxiliary power cell information storage 212, and an auxiliary power cell defect determiner 216. Details of the auxiliary power cell controller 211 and the auxiliary power cell information storage 212 included in the auxiliary power device manager 210 may be the same as those described with reference to FIGS. 4 to 6.

The auxiliary power cell controller 211 may provide the cell selection signal sgnX to the auxiliary power device 320. The respective switches connected to the selected auxiliary power cells may be turned on in response to the cell selection signal sgnX, and respective switches connected to the non-selected auxiliary power cells may be turned off. The auxiliary power cell defect determiner 216 may receive auxiliary power cell voltage information respectively corresponding to the auxiliary power cells for which the corresponding switch is turned on. The auxiliary power cell defect determiner 216 may determine whether each of the auxiliary power cells is defective based on the received auxiliary power cell voltage information. The auxiliary power cell defect determiner 216 may provide auxiliary power cell state information indicating whether each of the auxiliary power cells is defective to the auxiliary power cell information storage 212. The auxiliary power cell information storage 212 may store the auxiliary power cell state information. A configuration of the auxiliary power cell defect determiner 216 and a method of operating the same will be described in detail later with reference to FIGS. 8 to 9B.

Figure 8:
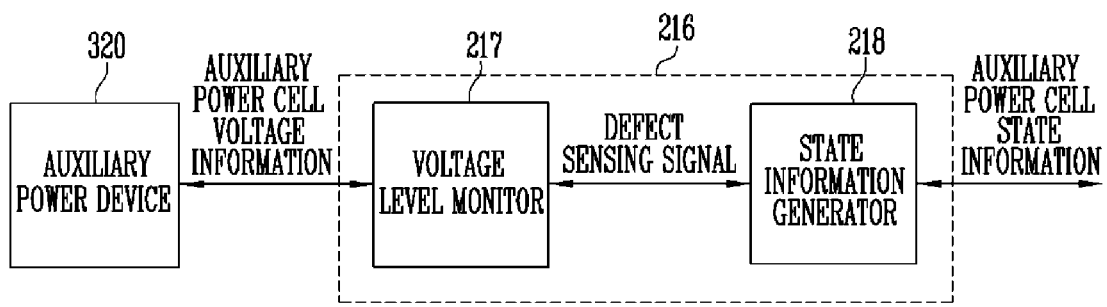
FIG. 8 illustrates a configuration of an auxiliary power cell defect determiner of FIG. 7 according to an embodiment.

FIG. 8 illustrates the configuration of the auxiliary power cell defect determiner 216 of FIG. 7 according to an embodiment.

The auxiliary power cell defect determiner 216 may include a voltage level monitor 217 and a state information generator 218. The auxiliary power cell defect determiner 216 may monitor respective voltage levels of the plurality of auxiliary power cells included in the auxiliary power device 320, and determine whether the voltage level is within a normal range. Specifically, the voltage level monitor 217 may monitor the voltage level of the charged auxiliary power cells among the plurality of auxiliary power cells included in the auxiliary power device 320. The voltage level monitor 217 may output a defect sensing signal indicating whether each of the auxiliary power cells is defective, in correspondence with a monitoring result. The defect sensing signal may include normal cell information and defect cell information. When the monitored voltage level of an auxiliary power cell is within the normal range, the defect sensing signal including the normal cell information may be generated for that auxiliary power cell. When the monitored voltage level of an auxiliary power cell is not within the normal range, the defect sensing signal including the defect cell information may be generated for that auxiliary power cell.

The plurality of auxiliary power cells each may be charged or may not be charged according to the cell selection signal sgnX received from the auxiliary power cell controller 211. The auxiliary power cell voltage information indicating the voltage level of each of the charged auxiliary power cells may be provided to the voltage level monitor 217. The voltage level monitor 217 may determine whether the voltage level included in the received auxiliary power cell voltage information is within a predetermined normal voltage level range. In various embodiments, the normal voltage level range may be set differently. The normal voltage level range may include a voltage level value between a lower limit voltage level and an upper limit voltage level. When the voltage level monitor 217 senses the voltage level within the normal voltage level range, the voltage level monitor 217 may provide the defect sensing signal including the normal cell information to the state information generator 218. When the voltage level monitor 217 senses the voltage level that is not within the normal voltage level range, the voltage level monitor 217 may provide the defect sensing signal including the defect cell information to the state information generator 218. The state information generator 218 may receive the defect sensing signal and generate the auxiliary power cell state information indicating whether each of the auxiliary power cells is defective. The auxiliary power cell state information may include information indicating normal auxiliary power cells and information indicating defective auxiliary power cells. The voltage level charged in the normal auxiliary power cell may be within the normal voltage level range. The voltage level charged in the defective auxiliary power cell may not be within the normal voltage level range. In an embodiment, the auxiliary power cell state information indicating the normal auxiliary power cell may be expressed by "1". The auxiliary power cell state information indicating the defective auxiliary power cell may be expressed by "0".

For example, assume that the auxiliary power cell C1 is a normal auxiliary power cell. That is, it is assumed that the voltage level charged in the auxiliary power cell C1 is within a predetermined normal voltage level range. First, the auxiliary power cell C1 may be determined as a selected auxiliary power cell, and the auxiliary power cell C1 may be charged under control of the auxiliary power cell controller 211. The voltage level monitor 217 may sense a charge voltage level of the auxiliary power cell C1. Specifically, the auxiliary power cell voltage information indicating the voltage level charged in the auxiliary power cell C1 may be provided to the voltage level monitor 217. The voltage level monitor 217 may provide the defect sensing signal including the normal cell information for the auxiliary power cell C1 to the state information generator 218. The state information generator 218 may provide the auxiliary power cell state information corresponding to the auxiliary power cell C1 to the auxiliary power cell information storage. The auxiliary power cell state information may include information indicating that the auxiliary power cell C1 is the normal auxiliary power cell.

Next, assume that the auxiliary power cell C2 is a defective auxiliary power cell, so that the voltage level charged in the auxiliary power cell C2 is not within the predetermined normal voltage level range. First, the auxiliary power cell C2 may be determined as a selected auxiliary power cell, and the auxiliary power cell C2 may be charged under the control of the auxiliary power cell controller 211. The voltage level monitor 217 may sense a charge voltage level of the auxiliary power cell C2. Specifically, the auxiliary power cell voltage information indicating the voltage level charged in the auxiliary power cell C2 may be provided to the voltage level monitor 217. The voltage level monitor 217 may provide the defect sensing signal including the defect cell information for the auxiliary power cell C2 to the state information generator 218. The state information generator 218 may provide the auxiliary power cell state information corresponding to the auxiliary power cell C2 to the auxiliary power cell information storage. The auxiliary power cell state information may include information indicating that C2 is a defective auxiliary power cell.

Figure 9A:
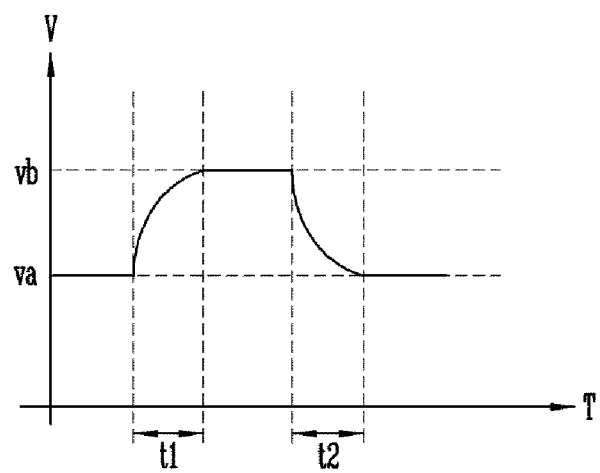
FIGS. 9A and 9B illustrate behavior of a normal auxiliary power cell and a defective auxiliary power cell, respectively.
Figure 9B:
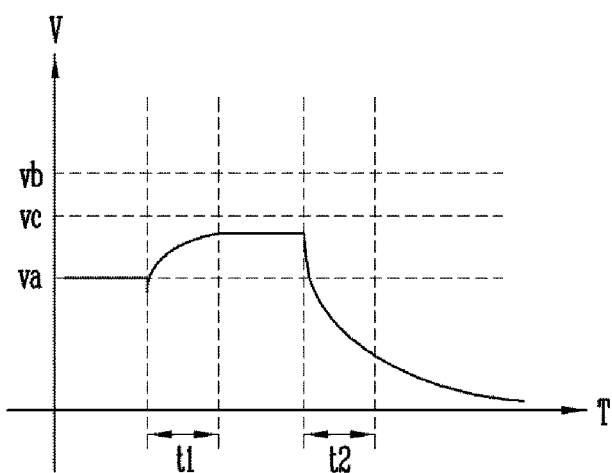

FIGS. 9A and 9B illustrate charging and discharging behavior of a normal auxiliary power cell and a defective auxiliary power cell of FIG. 8.

FIG. 9A is a graph illustrating a magnitude of the voltage level charged in a normal auxiliary power cell. FIG. 9B is a graph illustrating a magnitude of the voltage level charged in a defective auxiliary power cell. Referring to FIGS. 9A and 9B, a voltage of the normal auxiliary power cell may repeatedly rise and fall between a first voltage va and a second voltage vb. The first voltage va represents a voltage level of a discharged state of the auxiliary power cell. The second voltage vb represents a voltage level of a charged state of the auxiliary power cell. Specifically, the auxiliary power cell may be charged during a time t1. When the charge is completed, the voltage level of the auxiliary power cell may rise from the first voltage va to the second voltage vb. Next, the auxiliary power cell may be discharged during a time t2. When the discharge is completed, the voltage level of the auxiliary power cell may fall from the second voltage vb to the first voltage va. In an embodiment, the normal voltage level range may include a votage level range between equal to or less than the second voltage vb and equal to or greater than a third voltage vc. In a case of the normal auxiliary power cell, the magnitude of the charge voltage level may be within the normal voltage level range. In a case of the defective auxiliary power cell, the magnitude of the charge voltage level may be outside the normal voltage level range. In another embodiment, the defective auxiliary power cell may be in a non-charged state. The non-charged state may be a state in which the defective auxiliary power cell may be electrically shorted.

The voltage level monitor shown in FIG. 8 may receive the auxiliary power cell voltage information and obtain charge voltage level information included in the auxiliary power cell voltage information. The voltage level monitor may determine whether the obtained charge voltage level information is within a predetermined normal voltage level range and provide the defect sensing signal to the state information generator accordingly.

For example, after the auxiliary power cell is charged during the time t1, when the magnitude of charged voltage level is less than vc, as a result of sensing the magnitude of the charged voltage level by the voltage level monitor, a corresponding auxiliary power cell may be determined as the defective auxiliary power cell, and the voltage level monitor may provide the defect sensing signal including the defect cell information to the state information generator. The state information generator may receive the defect sensing signal including the defect cell information and provide the auxiliary power cell state information to the auxiliary power cell information storage. At this time, the auxiliary power cell state information may indicate the defective auxiliary power cell.

For example, after the auxiliary power cell is charged during the time t1, when the magnitude of charged voltage level is included in the range between vb and vc, as a result of sensing the magnitude of the charged voltage level by the voltage level monitor, a corresponding auxiliary power cell may be determined as the normal auxiliary power cell. As a result, the voltage level monitor may provide the defect sensing signal including the normal cell information to the state information generator. The state information generator may receive the defect sensing signal including the normal cell information and provide the auxiliary power cell state information to the auxiliary power cell information storage. At this time, the auxiliary power cell state information may indicate the normal auxiliary power cell.

In an embodiment the auxiliary power cell defect determiner 216 may turn on the switches connected to the selected auxiliary power cells one by one to determine whether selected auxiliary power cells are defective. For example, when the charge voltage level of a first selected auxiliary power cell having its corresponding switch turned on for the first period of time is less than vc, the first selected auxiliary power cell may be determined as the defective auxiliary power cell. However, if the first selected auxiliary power cell is instead determined to be a normal auxiliary power cell, and a switch of a second selected auxiliary power cell may be turned on for a second period of time. The auxiliary power cell defect determiner 216 may then monitor the voltage level charged in the auxiliary power device, and when the charge voltage level is less than 2vc, which is twice the vc level, the second selected auxiliary power cell charged for the second period of time may be determined as the defective auxiliary power cell. However, if both of the first selected auxiliary power cell and the second selected auxiliary power cell are determined as normal auxiliary power cells, a switch of a third selected auxiliary power cell may be turned on for the third period of time. The auxiliary power cell defect determiner 216 then may monitor the voltage level charged in the auxiliary power device, and when the charge voltage level is less than 3vc, which is three times the vc level, the third selected auxiliary power cell charged for the third period of time may be determined as the defective auxiliary power cell. In the manner described, it may be determined whether each of the predetermined number of selected auxiliary power cells is defective. As a result of sensing the charge voltage of the selected auxiliary power cell, when the selected auxiliary power cell is determined as the defective auxiliary power cell, an operation of charging other auxiliary power cells may be repeated until a predetermined number of selected auxiliary power cells that are nor defective is reached.

The auxiliary power cell defect determiner 216 may provide the auxiliary power cell state information indicating whether each of the selected auxiliary power cells is defective to the auxiliary power cell information storage 212. The auxiliary power cell information storage 212 may store the auxiliary power cell state information. According to an embodiment of the present technology, the auxiliary power cell defect determiner 216 may determine whether the selected auxiliary power cells are defective. In an embodiment, the auxiliary power cell defect determiner 216 may determine whether each of a plurality of other auxiliary power cells in addition to the selected auxiliary power cells is defective.

Figure 10:
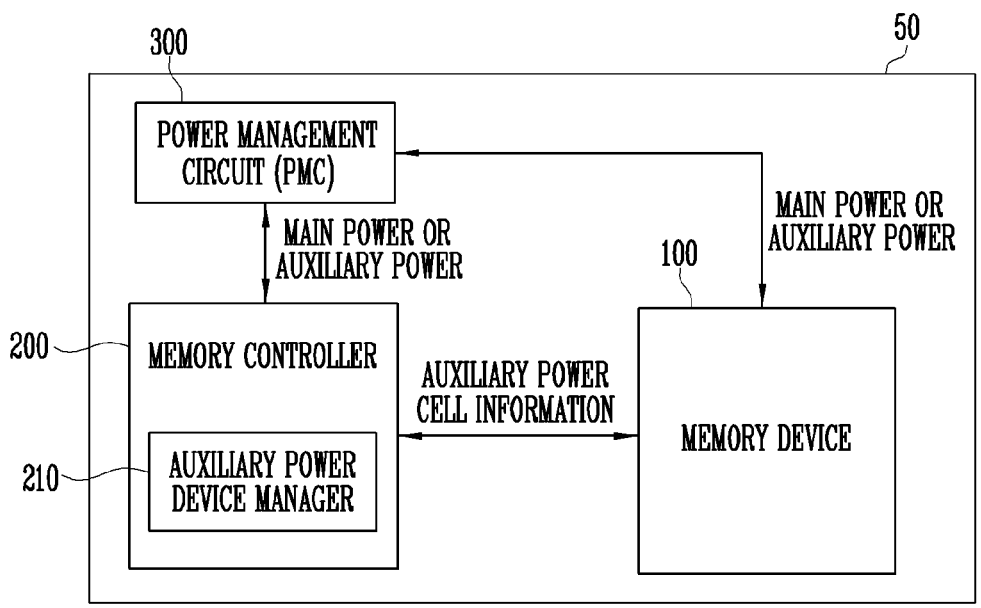
FIG. 10 illustrates a process in which auxiliary power cell information stored in the auxiliary power cell information storage is stored into a memory device.

FIG. 10 illustrates details of how the auxiliary power cell information stored in the auxiliary power cell information storage is stored into the memory device.

Referring to FIG. 10, the storage device 50 includes the same configurations as described with reference to FIG. 1. The auxiliary power cell information may include a cell number corresponding to each of the auxiliary power cells included in the auxiliary power device, whether each auxiliary power cell is defective, and the charge count of each auxiliary power cell. The auxiliary power cell information is required to be managed continuously for a lifespan of the storage device 50. Therefore, the auxiliary power cell information is required to be maintained even while power is not supplied to the storage device 50. The memory controller 200 may provide the auxiliary power cell information stored in the auxiliary power device manager 210 to the memory device 100. The memory device 100 may store the received auxiliary power cell information in at least one memory block of a plurality of memory blocks BLK1 to BLKz. More specifically, the auxiliary power cell information may be stored in a system block including configuration information necessary for operating the storage device 50.

When power is applied to the storage device 50, a booting operation may be performed. When the boot operation is performed, the memory controller 200 may obtain the auxiliary power cell information stored in the system block of the memory device 100. The obtained auxiliary power cell information may be stored into the auxiliary power cell information storage included in the auxiliary power device manager 210. The auxiliary power device manager 210 may determine the selected auxiliary power cell to be charged based on whether each of the auxiliary power cells is defective and the charge count in the manners described with reference to FIGS. 4 to 9.

Figure 11:
FIG. 11 is a diagram for describing the charge counts of the auxiliary power cells when the defective auxiliary power cell occurs.

FIG. 11 is a diagram for describing the charge counts of the auxiliary power cells when a defective auxiliary power cell occurs.

In the example of FIG. 11, the auxiliary power cell C2 is determined to be a defective auxiliary power cell at some point in time. When the charge is completed at the third charging cycle, similarly to the auxiliary power cell information storage 212-2 of FIG. 5, all of the charge counts of auxiliary power cell C2 to C10 may be two. Therefore, the selected auxiliary power cell determiner may determine the auxiliary power cells C2 to C8 as the selection auxiliary power cell in the fourth charging cycle. Although the corresponding switch is turned on by the cell selection signal sgn2 and the auxiliary power cell C2 is charged, the auxiliary power cell defect determiner may determine that the auxiliary power cell C2 is defective by sensing the charge voltage of the auxiliary power cell C2. The auxiliary power cell defect determiner may provide the auxiliary power cell state information indicating that the auxiliary power cell C2 is the defective auxiliary power cell to an auxiliary power cell information storage 212-3. The auxiliary power cell information storage 212-3 may store information indicating that the auxiliary power cell C2 is the defective auxiliary power cell. The selected auxiliary power cell determiner may therefore additionally determine C9 as a selected auxiliary power cell in the fourth charging cycle. The auxiliary power cell information storage 212-3 may include final charge count information of each of the auxiliary power cells and information indicating whether each of the auxiliary power cells is defective. Specifically, the auxiliary power cell C1 may be indicated as being a normal auxiliary power cell, and its charge count may be three. The auxiliary power cell C2 may be the defective auxiliary power cell, and the charge count may be two. The auxiliary power cells C3 to C9 may be indicated as being normal auxiliary power cells, and their respective charge counts may be three. The auxiliary power cell C10 may be indicated as being a normal auxiliary power cell, and its charge count may be two.

Figure 12:
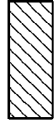
FIG. 12 is a diagram for describing the charge counts of the auxiliary power cells when auxiliary power device is charged following FIG. 11.

FIG. 12 is a diagram for describing the charge counts of the auxiliary power cells when the auxiliary power device is charged following FIG. 11.

According to FIG. 12, before a fifth charging cycle is performed, the auxiliary power cell controller 211 may refer to an auxiliary power cell information storage 212-4. The auxiliary power cell controller 211 may not determine that the auxiliary power cell C2, which was determined to be a defective auxiliary power cell in the fourth charging cycle, as a selected auxiliary power cell. The auxiliary power cell controller 211 may determine the auxiliary power cells having the smallest charge counts among the normal auxiliary power cells as the selected auxiliary power cells. Specifically, the auxiliary power cells C1, C3 to C7, and C10 may be determined as the selected auxiliary power cells. The switches respectively connected to the selected auxiliary power cells may be turned on and the selected auxiliary power cells may be charged. The auxiliary power cell controller 211 may update and store the charge counts corresponding to the auxiliary power cells C1, C3 to C7, and C10 in the auxiliary power cell information storage 212-4. That is, since the auxiliary power cells C1, C3 to C7, and C10 are selected as the selected auxiliary power cells in the fifth charging cycle, the charge counts corresponding to each of the auxiliary power cells C1, C3 to C7, and C10 may be increased by one. Therefore, when the fifth charging cycle is ended, the charge counts corresponding to C1 and C3 to C7 may be four. The charge counts corresponding to C8 to C10 may be three. The charge count corresponding to C2 may be maintained as two.

In a sixth charging cycle, the auxiliary power cell controller 211 may obtain the charge count information of the auxiliary power cells with reference to the auxiliary power cell information storage 212-4. The auxiliary power cell controller 211 may not determine that the defective auxiliary power cell C2 as a selected auxiliary power cell. The auxiliary power cell controller 211 may determine the normal auxiliary power cells having the smallest charge counts as the selected auxiliary power cells. Since the charge counts corresponding to each of the auxiliary power cells C8 to C10 stored in the auxiliary power cell information storage 212-4 are three, the auxiliary power cell controller 211 may determine the auxiliary power cells C8 to C10 as selected auxiliary power cells. Next, the auxiliary power cell controller 211 may further determine four additional selected auxiliary power cells with reference to the auxiliary power cell information storage 212-4. Since all the charge counts of the auxiliary power cells C1 and C3 to C7 are four, four selected auxiliary power cells may be determined from among the auxiliary power cells C1 and C3 to C7. In an embodiment, among the auxiliary power cells of which the charge counts are the same, the auxiliary power cell of which the corresponding cell number is smaller may be preferentially determined as the selected auxiliary power cell. In another embodiment, the four selected auxiliary power cells may be determined in a random manner from among the auxiliary power cells C1 and C3 to C7. In this example, the auxiliary power cell information storage 212-4 reflects that C1 and C3 to C5 are determined as the selected auxiliary power cells in an order of decreasing cell number. The switches respectively connected to the selected auxiliary power cells may be turned on and the selected auxiliary power cells may be charged. The auxiliary power cell controller 211 may update the charge counts corresponding to the auxiliary power cells C1, C3 to C5, and C8 to C10 to an increased value by one, respectively, and store the charge counts in the auxiliary power cell information storage 212-4. Since the auxiliary power cell C2 is the defective auxiliary power cell, the auxiliary power cell C2 may not be charged, and the charge counts corresponding to C2 may be maintained as two. Subsequent charge cycles may also be performed in the same manner. According to an embodiment of the present technology, except for C2 that has been determined to be a defective auxiliary power cell, the charge counts of each of the remaining auxiliary power cells may be evenly distributed.

Figure 13:
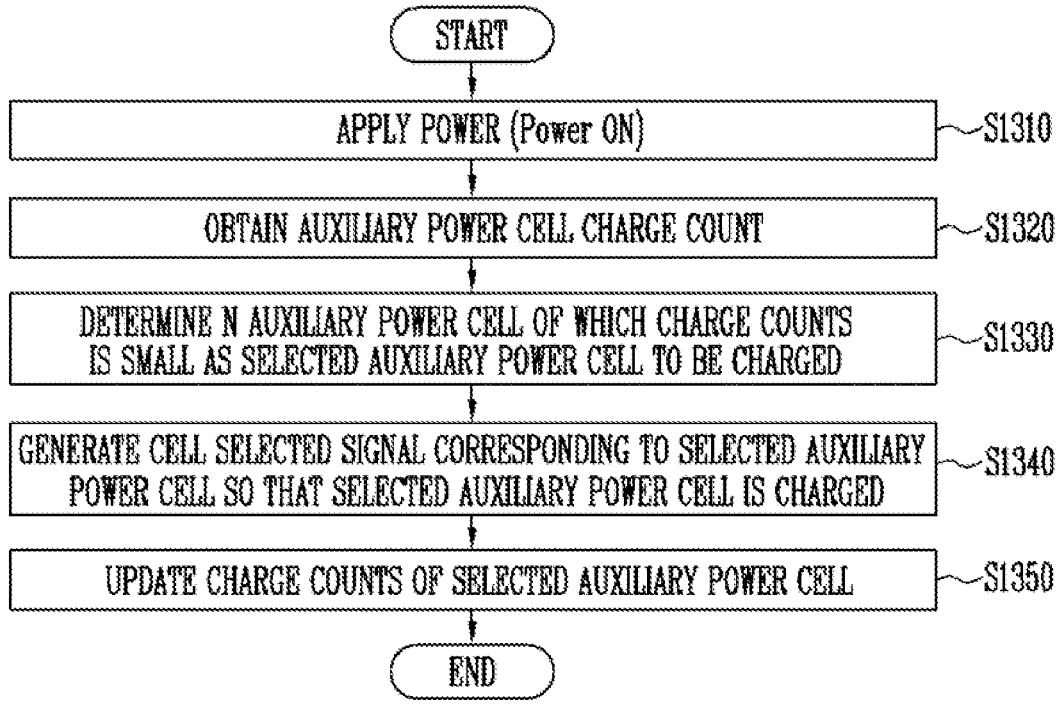
FIG. 13 is a flowchart illustrating an operation of determining the auxiliary power cell to be charged by an auxiliary power device manager according to an embodiment.

FIG. 13 is a flowchart illustrating a process 1300 for determining the auxiliary power cell to be charged by the auxiliary power device manager according to an embodiment. The process 1300 may be performed by the auxiliary power cell controller 211.

In step S1310, power may be applied to the storage device (Power On).

In step S1320, the auxiliary power cell controller 211 may obtain the charge counts corresponding to each of the auxiliary power cells stored in the auxiliary power cell information storage 212. Specifically, the memory controller may read the auxiliary power cell information stored in the memory device and store the auxiliary power cell information into the auxiliary power cell information storage 212.

In step S1330, the auxiliary power cell controller 211 may determine the normal auxiliary power cell having the smallest charge count as a selected auxiliary power cell to be charged, based on the charge counts of each of the auxiliary power cells stored in the auxiliary power cell information storage 212. In more detail, N predetermined auxiliary power cells may be determined to be selected auxiliary power cells according to the order started from the smallest charge counts of each of the auxiliary power cells. In an embodiment, among the auxiliary power cells of which the charge counts is the same, the auxiliary power cell of which the corresponding cell number is smaller may be preferentially determined as the selected auxiliary power cell. In another embodiment, when there are a plurality of auxiliary power cells of which the charge counts are the same, the selected auxiliary power cells may be selected from among them in a random manner. Furthermore, the auxiliary power cell controller 211 may not determine the defective auxiliary power cells as the selected auxiliary power cell. The defective auxiliary power cell may be an auxiliary power cell of which the magnitude of the charge voltage level is not within a normal voltage level range. The normal voltage level range may have a predetermined value.

In step S1340, the auxiliary power cell controller 211 may control the selected auxiliary power cells determined in step S1320 to be charged. Each of the selected auxiliary power cells may be respectively connected to switches. The auxiliary power cell controller 211 may generate the cell selection signal sgnX for controlling on/off states of the switches and provide the cell selection signal sgnX to each of the switches. When a switch is turned on according to the cell selection signal sgnX, the selected auxiliary power cell connected to that switch may be electrically connected to the power controller 310 of FIG. 2, and may therefore be charged. The unselected auxiliary power cells may not be electrically connected to the power controller 310 of FIG. 2, and thus the unselected auxiliary power cells may not be charged. In the same manner, a predetermined number of selected auxiliary power cells may be charged one by one.

In step S1350, the auxiliary power cell controller 211 may update the charge counts stored in the auxiliary power cell information storage. Specifically, the charge counts corresponding to each of the selected auxiliary power cells charged in step S1330 may be increased by one. The charge counts of the unselected auxiliary power cells may be maintained at their previous values. After the selected auxiliary power cells are charged, the auxiliary power cell controller 211 may store the auxiliary power cell information, which is stored in the auxiliary power cell information storage, into the memory device. The auxiliary power cell information stored in the memory device may be maintained even though power is not applied.

Figure 14:
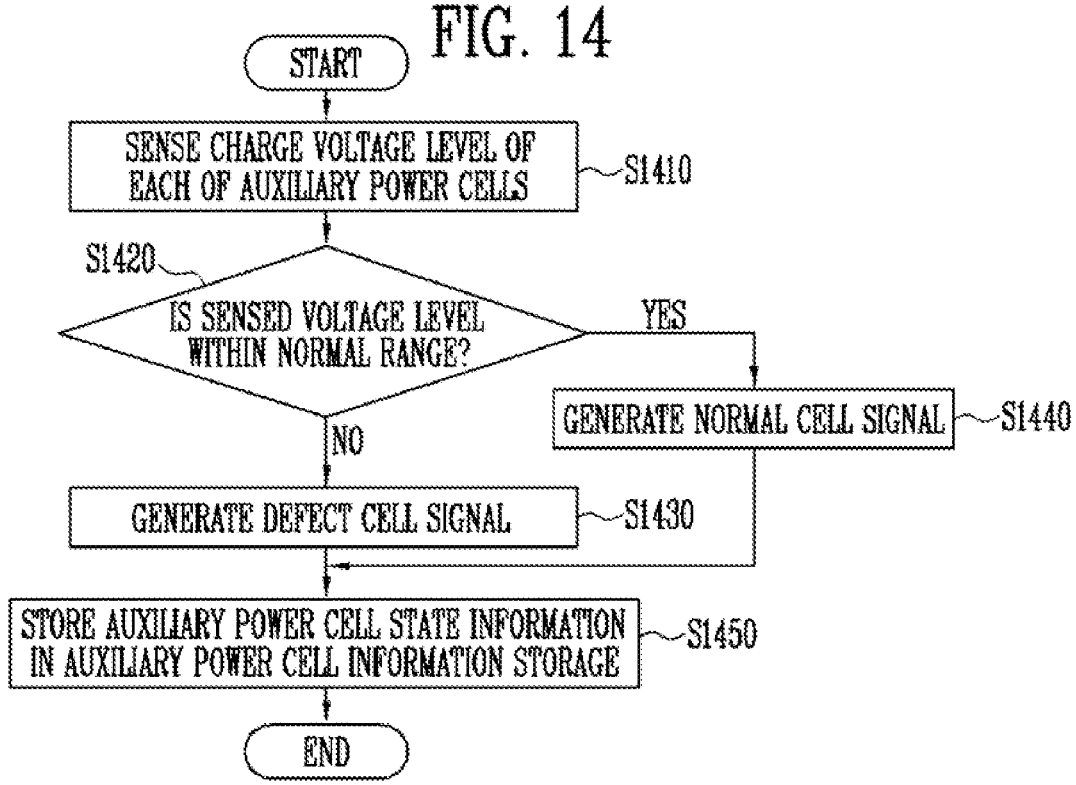
FIG. 14 is a flowchart illustrating a process for determining whether auxiliary power cells are defective according to an embodiment.

FIG. 14 is a flowchart illustrating a process 1400 for determining whether the auxiliary power cells are defective, according to an embodiment. The process 1400 may be performed by the auxiliary power cell defect determiner 216.

In step S1410, the auxiliary power cell defect determiner 216 may sense the charge voltage level of each of the auxiliary power cells. Specifically, in step S1340 of FIG. 13, the auxiliary power cell controller 211 may control the selected auxiliary power cells to be charged. In step S1410, the auxiliary power cell defect determiner 216 may receive voltage information of the charged auxiliary power cells. The auxiliary power cell voltage information may include information indicating the magnitude of the charge voltage level of each of the auxiliary power cells.

In step S1420, the auxiliary power cell defect determiner 216 may determine whether the charge voltage level of a selected auxiliary power cell is within the normal voltage level range. The normal voltage level range may have a predetermined value. When the charge voltage level is within the normal voltage level range, the process 1400 proceeds to step S1440. When the charge voltage level is not within the normal voltage level range, the process 1400 proceeds to step S1430.

In step S1430, when the charge voltage level charged in the auxiliary power cell is not within the normal voltage level range, the auxiliary power cell defect determiner 216 may generate a defect cell signal.

In step S1440, when the charge voltage level charged in the auxiliary power cell is within the normal voltage level range, the auxiliary power cell defect determiner 216 may generate a normal cell signal.

In step S1450, the auxiliary power cell defect determiner 216 may store information indicating whether each of the auxiliary power cells is defective according to the corresponding defect cell signal or normal cell signal into the auxiliary power cells information storage. The auxiliary power cell stored as the defective auxiliary power cell in the auxiliary power cell information storage may not be charged in a subsequently-performed auxiliary power cell charge operation.

Figure 15:
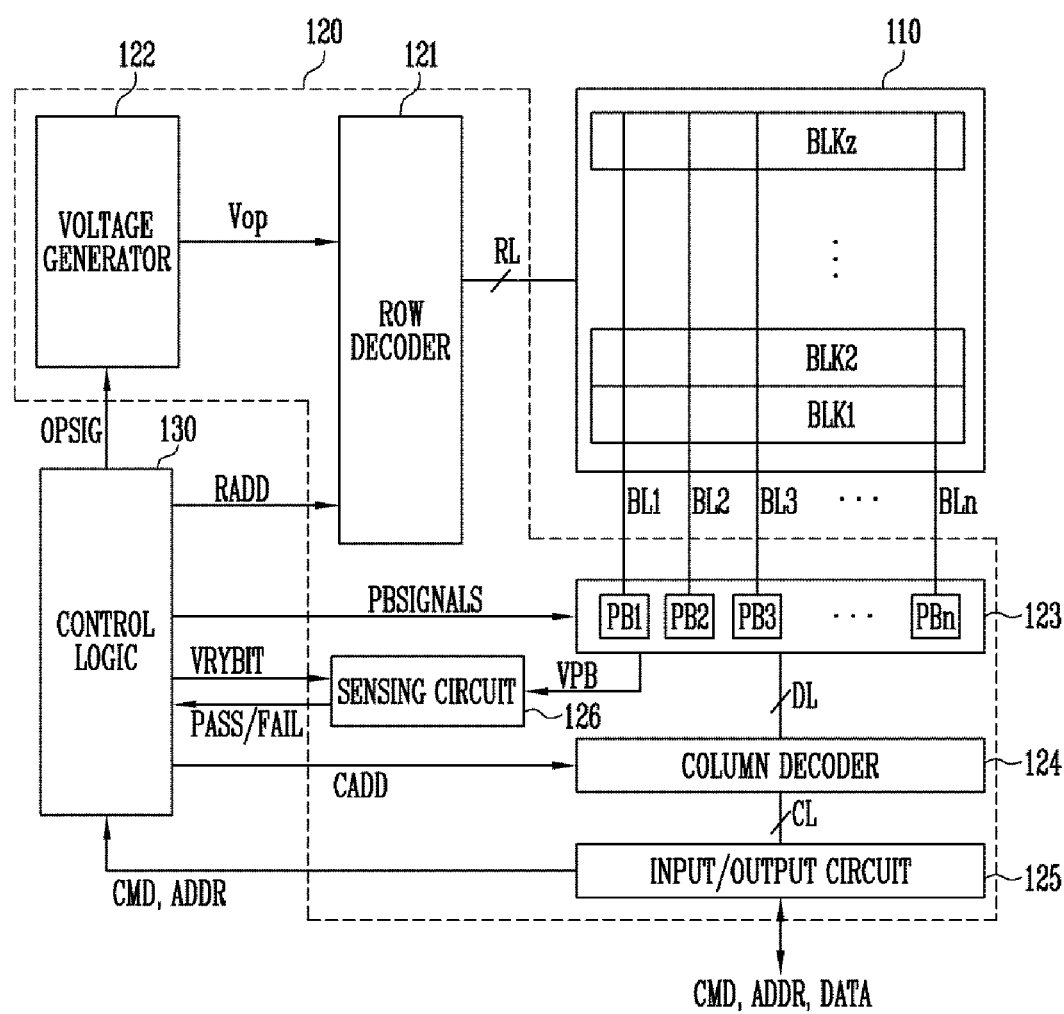
FIG. 15 illustrates a memory device according to an embodiment of the present disclosure.

FIG. 15 is a diagram for describing the memory device 100 according to an embodiment of the present disclosure.

Referring to FIG. 15, the memory device may include a memory cell array 110, a peripheral circuit 120, and a control logic 130.

The memory cell array 110 includes the plurality of memory blocks BLK1 to BLKz. The plurality of memory blocks BLK1 to BLKz are connected to a row decoder 121 through row lines RL. The memory blocks BLK1 to BLKz may be connected to a page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Thus, one memory block may include a plurality of pages. According to an embodiment of the present disclosure, the auxiliary power cell information may be stored in at least one memory block of the plurality of memory blocks BLK1 to BLKz included in the memory cell array 110. The at least one memory block of the plurality of memory blocks BLK1 to BLKz may be a system block including system information. The system information may include information required to control the operation of the memory device 100. For example, the system information may include valid data information, bad block information, mapping data, and the like. The auxiliary power cell information according to an embodiment of the present disclosure may be stored in a system block. The auxiliary power cell information stored in the system block may be read and stored in the memory controller 200 when the storage device is booted.

The row lines RL may include at least one source select line, a plurality of word lines, and at least one drain select line.

Each of the memory cells included in the memory cell array 110 may be configured as a single level cell (SLC) storing one data bit, a multi-level cell (MLC) storing two data bits, a triple level cell (TLC) storing three data bits, or a quad level cell (QLC) storing four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to the control of the control logic 130. The row decoder 121 receives a row address RADD from the control logic 130.

The row decoder 121 is configured to decode the row address RADD. The row decoder 121 selects at least one memory block among the memory blocks BLK1 to BLKz according to a decoded address. In addition, the row decoder 121 may select at least one word line of the selected memory block so as to apply voltages generated by the voltage generator 122 to at least one word line WL according to the decoded address.

For example, during the program operation, the row decoder 121 may apply a program voltage to a selected word line and apply a program pass voltage of a level lower than that of the program voltage to unselected word lines. During a program verify operation, the row decoder 121 may apply a verify voltage to the selected word line and apply a verify pass voltage higher than the verify voltage to the unselected word lines. During the read operation, the row decoder 121 may apply a read voltage to the selected word line and apply a read pass voltage higher than the read voltage to the unselected word lines.

In an embodiment, the erase operation of the memory device 100 is performed in a memory block unit. During the erase operation, the row decoder 121 may select one memory block according to the decoded address. During the erase operation, the row decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device. Specifically, the voltage generator 122 may generate various operation voltages Vop used in the program, read, and erase operations in response to operation signal OPSIG. For example, the voltage generator 122 may generate a program voltage, a verify voltage, a pass voltage, a read voltage, an erase voltage, and the like in response to the control of the control logic 130.

In an embodiment, the voltage generator 122 may generate an internal power voltage by regulating an external power voltage. The internal power voltage generated by the voltage generator 122 is used as an operation voltage of the memory device 100.

In an embodiment, the voltage generator 122 may generate a plurality of voltages using an external power voltage or an internal power voltage.

For example, the voltage generator 122 may include a plurality of pumping capacitors that receive the internal power voltage, and selectively activate the plurality of pumping capacitors in response to the control of the control logic 130 to generate the plurality of voltages.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate under the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage of a current of the bit lines BL1 to BLn during the read or verify operation.

Specifically, during the program operation, when a program pulse is applied to the selected word line, the first to n-th page buffers PB1 to PBn may transfer data DATA, which is received through the data input/output circuit 125, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have an increased threshold voltage. A threshold voltage of a memory cell connected to a bit line to which a program prohibition voltage (for example, the power voltage) is applied may be maintained. During the program verify operation, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the data input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to the column address CADD. For example, the column decoder 124 may exchange data with the first to n-th page buffers PB1 to PBn through data lines D1 or may exchange data with the input/output circuit 125 through column lines CL.

The input/output circuit 125 may transfer the command CMD and the address ADDR received from the memory controller 200 described with reference to FIG. 1 to the control logic 130, or may exchange the data DATA with the column decoder 124.

The sensing circuit 126 may generate a reference current in response to a permission bit signal VRYBIT during the read operation or the verify operation, and may compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit signal VRYBIT in response to the command CMD and the address ADDR to control the peripheral circuits 120. In addition, the control logic 130 may determine whether the verify operation is passed or failed in response to the pass or fail signal PASS or FAIL.

Figure 16:
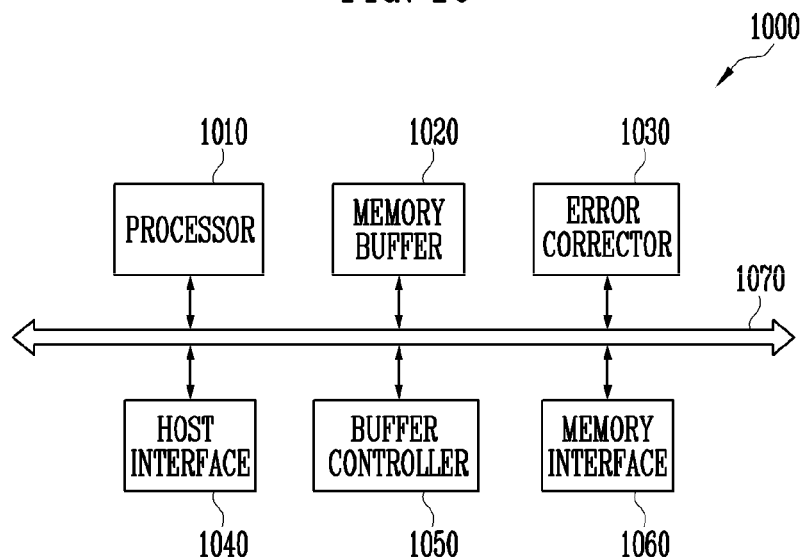
FIG. 16 illustrates another embodiment of the memory controller of FIG. 1.

FIG. 16 is a diagram for describing another embodiment of the memory controller of FIG. 1.

The memory controller 1000 is connected to a host and the memory device. The memory controller 1000 is configured to access the memory device in response to the request from the host.

Referring to FIG. 16, the memory controller 1000 may include a processor 1010, a memory buffer 1020, an error corrector (ECC) 1030, a host interface 1040, a buffer control circuit 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 is configured to randomize data received from the host. For example, the processor 1010 may randomize the data received from the host using a random seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a random seed. The de-randomized data may be output to the host.

As an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. The error corrector 1030 may perform error correction encoding (ECC encoding) based on data to be written to the memory device through memory interface 1060. The error correction encoded data may be transferred to the memory device through the memory interface 1060. The error corrector 1030 may perform error correction decoding (ECC decoding) on the data received from the memory device through the memory interface 1060. As an example, the error corrector 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

As an example, the memory controller 1000 may not include the memory buffer 1020 and the buffer controller 1050.

As an example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

As an example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1202, and the memory interface 1060.

In an embodiment, the memory buffer 1020 of FIG. 16 may include the auxiliary cell information storage 212 described with reference to FIGS. 4, 6, and 7. In an embodiment, the process 1300 and 1400 described above, among others, may be performed using firmware executed by the processor 1010.

Figure 17:
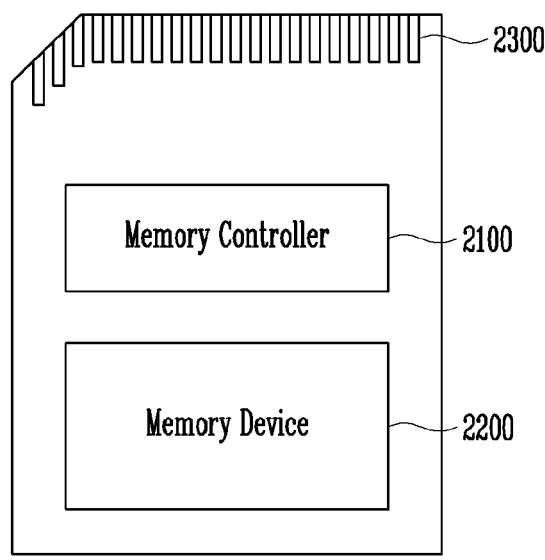
FIG. 17 illustrates a memory card system including a storage device according to an embodiment of the present disclosure.

FIG. 17 is a block diagram illustrating a memory card system to which the storage device including the memory controller according to an embodiment of the present disclosure is applied.

Referring to FIG. 17, the memory card system 2000 includes a memory controller 2100, a memory device 2200, and a connector 2300.

The memory controller 2100 is connected to the memory device 2200. The memory controller 2100 is configured to access the memory device 2200. The memory controller 2100 may be implemented equally to the memory controller 200 described with reference to FIG. 1.

As an example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

As an example, the memory controller 2100 or the memory device 2200 may be packaged and provided as one semiconductor package in a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP). Alternatively, the memory device 2200 may include a plurality of non-volatile memory chips, and the plurality of non-volatile memory chips may be packaged and provided as one semiconductor package based on the above-described package processes.

As an example, the memory controller 2100 and the memory device 2200 may be integrated into one semiconductor device. As an example, the memory controller 2100 and the memory device 2200 may be integrated into one semiconductor device to configure a solid state drive (SSD). The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

As an example, the memory device 2200 may be the memory device 100 described with reference to FIG. 2.

Figure 18:
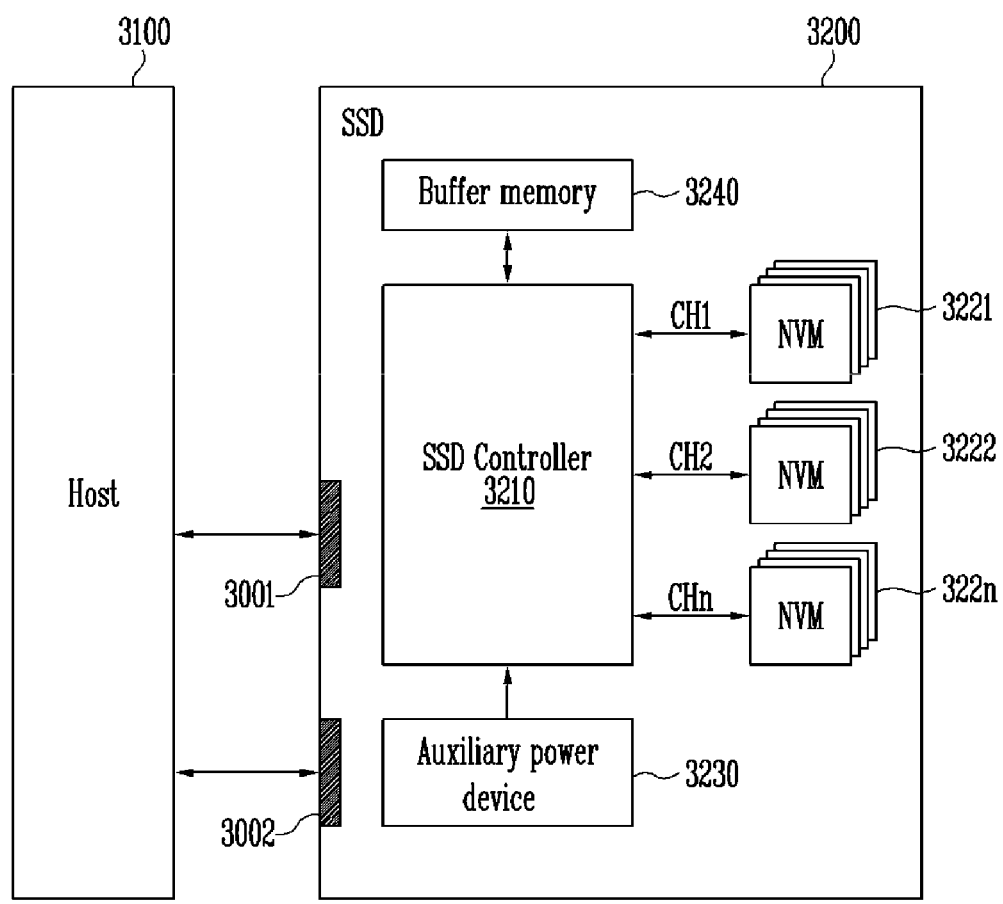
FIG. 18 illustrates a solid state drive (SSD) system including a storage device according to an embodiment of the present disclosure.

FIG. 18 is a block diagram illustrating a solid state drive (SSD) system to which the storage device including the memory controller according to an embodiment of the present disclosure is applied.

Referring to FIG. 18, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

As an example, the non-volatile memories 3321 to 322n may be the memory device 100 described with reference to FIG. 2.

Figure 19:
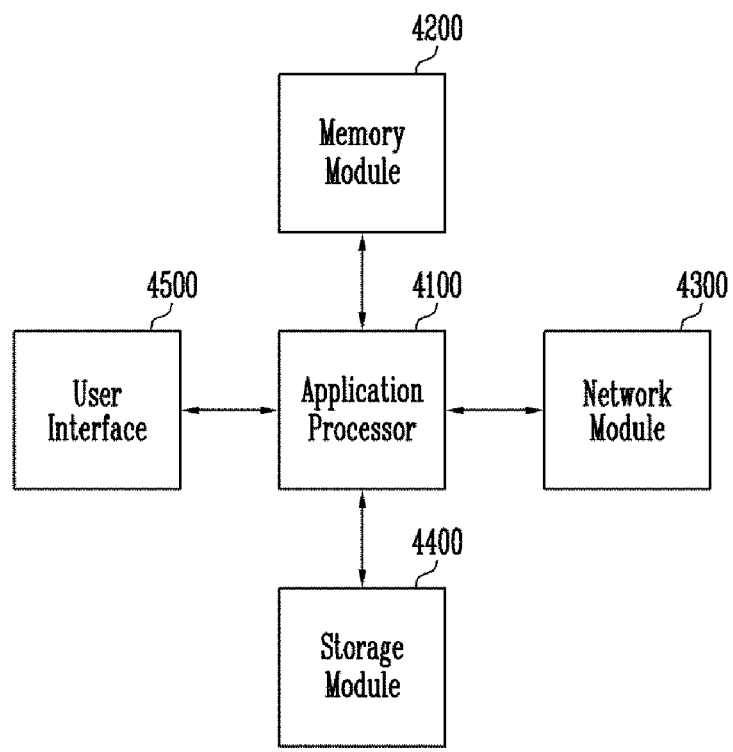
FIG. 19 is a block diagram illustrating a user system including a storage device according to an embodiment of the present disclosure.

FIG. 19 is a block diagram illustrating a user system to which the storage device including the memory controller according to an embodiment of the present disclosure is applied.

Referring to FIG. 19, the user system 4000 includes an application processor 4100, a memory module 4200, a network module 4300, a storage module 4400, and a user interface 4500.

The application processor 4100 may drive components, an operating system (OS), a user program, or the like included in the user system 4000. As an example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. As an example, the application processor 4100 and memory module 4200 may be packaged based on a package on package (POP) and provided as one semiconductor package.

The network module 4300 may communicate with external devices. As an example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. As an example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. As an example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. As an example, the storage module 4400 may be provided as a removable storage device (removable drive), such as a memory card, and an external drive of the user system 4000.

As an example, the storage module 4400 may include a plurality of non-volatile memory devices, and the plurality of non-volatile memory devices may be the memory device 100 described with reference to FIG. 2. The storage module 4400 may include a memory controller according to an embodiment.

The user interface 4500 may include interfaces for inputting data or an instruction to the application processor 4100 or for outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a motor.

What is claimed is:

1. A memory controller that controls an operation of a memory device, the memory controller comprising:
    an auxiliary power cell information storage including charge count information of each of a plurality of auxiliary power cells included in an auxiliary power device that supplies auxiliary power as a substitute for main power to the memory device and the memory controller; and
    an auxiliary power cell controller configured to control the charging of the plurality of auxiliary power cells based on the charge count information so that the differences between respective charge counts of the plurality of auxiliary power cells are minimized.

2. The memory controller of claim 1, wherein the auxiliary power cell controller comprises:
    a selected auxiliary power cell determiner configured to generate, according to the charge count information, auxiliary power cell selection information including information on selected auxiliary power cells that are auxiliary power cells to be charged; and
    an auxiliary power cell charge signal generator configured to generate cell selection signals for selecting the selected auxiliary power cells according to the auxiliary power cell selection information.

3. The memory controller of claim 2, wherein the selected auxiliary power cell determiner selects a predetermined number of the plurality of auxiliary power cells having a relatively small charge counts as the selected auxiliary power cells.

4. The memory controller of claim 3, wherein the predetermined number is the number smaller than the number of the plurality of auxiliary power cells.

5. The memory controller of claim 2, wherein the charge count information includes cell numbers respectively identifying the plurality of auxiliary power cells and charge counts respectively indicating respective charge counts of the plurality of auxiliary power cells, and
    the selected auxiliary power cell determiner determines the selected auxiliary power cell according to an order started from the smallest cell number among auxiliary power cells having respective charge counts that are the same.

6. The memory controller of claim 2, further comprising:
    an auxiliary power cell defect determiner configured to generate information indicating whether or not the selected auxiliary power cells are defective.

7. The memory controller of claim 6, wherein the auxiliary power cell information storage includes information respectively indicating whether or not the auxiliary power cells are defective.

8. The memory controller of claim 6, wherein the auxiliary power cell defect determiner comprises:
    a voltage level monitor configured to monitor a voltage level of a charged auxiliary power cell among the auxiliary power cells and generate a defect sensing signal according to a monitoring result; and
    a state information generator configured to generate state information of the charged auxiliary power cell based on the defect sensing signal.

9. The memory controller of claim 8,
    wherein when the voltage level of the charged auxiliary power cell is less than a predetermined voltage level, the voltage level monitor generates the defect sensing signal indicating that the charged auxiliary power cell is defective; and
    wherein when the voltage level of the charged auxiliary power cell is equal to or greater than a predetermined voltage level, the voltage level monitor generates the defect sensing signal indicating that the charged auxiliary power cell is normal.

10. The memory controller of claim 1, wherein the charge count information includes respective charge counts for the plurality of auxiliary power cells, and the charge counts corresponding to auxiliary power cells in which electrical energy is accumulated are increased when the main power is applied to the auxiliary power device.

11. The memory controller of claim 1, wherein the auxiliary power cell controller further includes an auxiliary power cell charge count manager configured to update the charge count information.

12. The memory controller of claim 1, wherein the auxiliary power cell controller controls the memory device so that the charge count information is stored in the memory device, and the memory device is a non-volatile memory device.

13. The memory controller of claim 1, wherein the auxiliary power cell controller obtains the charge count information stored in the memory device and provides the charge count information to the auxiliary power cell information storage.

14. The memory controller of claim 1, wherein the auxiliary power cell information storage is included in a volatile memory device.

15. A storage device comprising:
    a memory device including a plurality of memory blocks;
    a memory controller configured to control an operation of the memory device; and
    a power management circuit configured to supply power to the memory device and the memory controller,
    wherein the power management circuit comprises:
    a power controller configured to receive main power from an outside of the power management circuit; and
    an auxiliary power device including a plurality of auxiliary power cells,
    wherein the memory controller obtains auxiliary power cell information stored in at least one memory block of the plurality of memory blocks, and controls the auxiliary power device so that selected auxiliary power cells, which are determined based on charge count information of the plurality of auxiliary power cells included in the auxiliary power cell information, are charged, and unselected auxiliary power cells are not charged.

16. The storage device of claim 15, wherein the memory controller selects one or more auxiliary power cells of the plurality of auxiliary power cells that have relatively small charge counts among the plurality of auxiliary power cells as the selected auxiliary power cells.

17. The storage device of claim 15, wherein the power controller provides a charge voltage to the auxiliary power device while the main power is input.

18. The storage device of claim 15, wherein, when a voltage level of the main power is less than a predetermined value, the power controller provides auxiliary power provided using electrical energy stored in the auxiliary power device to the memory device and the memory controller.

19. The storage device of claim 15, wherein the memory controller controls the memory device so that the auxiliary power cell information is stored in the memory device.

20. The storage device of claim 15, wherein the charge count information includes respective charge counts for the plurality of auxiliary power cells, and the charge counts corresponding to auxiliary power cells in which electrical energy is accumulated are increased when main power is applied to the auxiliary power device.

21. A method of operating a memory controller that controls an operation of a memory device, the method comprising:

obtaining charge counts respectively corresponding to each of a plurality of auxiliary power cells configured to supply auxiliary power to the memory device and the memory controller;

determining, based on the charge counts, a predetermined number of selected auxiliary power cells that are auxiliary power cells to be charged from among the plurality of auxiliary power cells; and controlling the selected auxiliary power cells to charge the selected auxiliary power cells.

\* \* \* \* \*